(12) United States Patent
Baek et al.

(10) Patent No.: US 11,068,110 B2
(45) Date of Patent: Jul. 20, 2021

(54) ELECTRONIC APPARATUS AND METHOD OF FABRICATING THE SAME

(71) Applicant: Samsung Display Co., Ltd., Yongin-si (KR)

(72) Inventors: Yeonha Baek, Hwaseong-si (KR); Kinyeng Kang, Sejong-si (KR); Hyuk-Jin Kim, Asan-si (KR); Minhwan Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/230,108

(22) Filed: Dec. 21, 2018

(65) Prior Publication Data

US 2019/0196661 A1 Jun. 27, 2019

(30) Foreign Application Priority Data

Dec. 21, 2017 (KR) ........................ 10-2017-0177442

(51) Int. Cl.
*G06F 3/042* (2006.01)
*G09G 3/3225* (2016.01)
(Continued)

(52) U.S. Cl.
CPC ............ *G06F 3/0428* (2013.01); *G06F 3/047* (2013.01); *G06F 3/0418* (2013.01); *G06F 3/0443* (2019.05); *G06F 3/0446* (2019.05); *G06K 9/03* (2013.01); *G09G 3/006* (2013.01); *G09G 3/3225* (2013.01); *G06F 3/044* (2013.01); *G06F 3/0488* (2013.01); *G06F 2203/04103* (2013.01); *G06F 2203/04111* (2013.01);
(Continued)

(58) Field of Classification Search
None
See application file for complete search history.

(56) References Cited

U.S. PATENT DOCUMENTS 8,462,129 B2 * 6/2013 Miyayama ............ G06F 3/0418
345/173
9,201,555 B2 12/2015 Anno
(Continued)

FOREIGN PATENT DOCUMENTS

KR 10-2015-0097055 8/2015
KR 10-2016-0099791 8/2016

*Primary Examiner* — Dorothy Harris
(74) *Attorney, Agent, or Firm* — H.C. Park & Associates, PLC

(57) ABSTRACT

An electronic apparatus includes: a first sensor pattern including having a first peripheral area extending in a first direction; a second sensor pattern spaced apart from the first sensor pattern and having a second peripheral area, the second peripheral area extending in the first direction and facing the first peripheral area in a second direction intersecting the first direction to form a boundary between the first and second sensor patterns; first and second connection patterns connected to the first and second sensor patterns, respectively, and disposed on layers different from the first connection pattern; and a first pattern overlapping the first peripheral area in a plan view and spaced apart from the second sensor pattern to increase visibility of the boundary, and wherein each of the first sensor pattern and the second sensor pattern includes a plurality of mesh lines defining a plurality of openings.

24 Claims, 27 Drawing Sheets

(51) Int. Cl.
*G06F 3/047* (2006.01)
*G06F 3/044* (2006.01)
*G06K 9/03* (2006.01)
*G06F 3/041* (2006.01)
*G09G 3/00* (2006.01)
*H01L 27/32* (2006.01)
*G06F 3/0488* (2013.01)

(52) U.S. Cl.
CPC .............. *G06F 2203/04112* (2013.01); *G09G 2330/08* (2013.01); *H01L 27/323* (2013.01)

(56) References Cited

U.S. PATENT DOCUMENTS

| | | | |
|---|---|---|---|
| 9,927,939 B2 | 3/2018 | Na et al. | |
| 2010/0045614 A1* | 2/2010 | Gray | G06F 3/044 345/173 |
| 2011/0227858 A1* | 9/2011 | An | G06F 3/044 345/174 |
| 2012/0118614 A1* | 5/2012 | Kuriki | G06F 3/044 174/250 |
| 2013/0278513 A1* | 10/2013 | Jang | G06F 3/047 345/173 |
| 2015/0212613 A1* | 7/2015 | Fowlkes | G06F 1/16 345/173 |
| 2015/0309637 A1* | 10/2015 | Sakuishi | G02F 1/13338 345/174 |
| 2016/0018925 A1* | 1/2016 | Yashiro | G06F 3/044 345/174 |
| 2016/0048248 A1* | 2/2016 | Na | G06F 3/047 345/174 |
| 2016/0246405 A1* | 8/2016 | Hu | G06F 3/0446 |
| 2017/0052627 A1 | 2/2017 | Kim et al. | |
| 2017/0364175 A1* | 12/2017 | Park | G06F 3/044 |

* cited by examiner

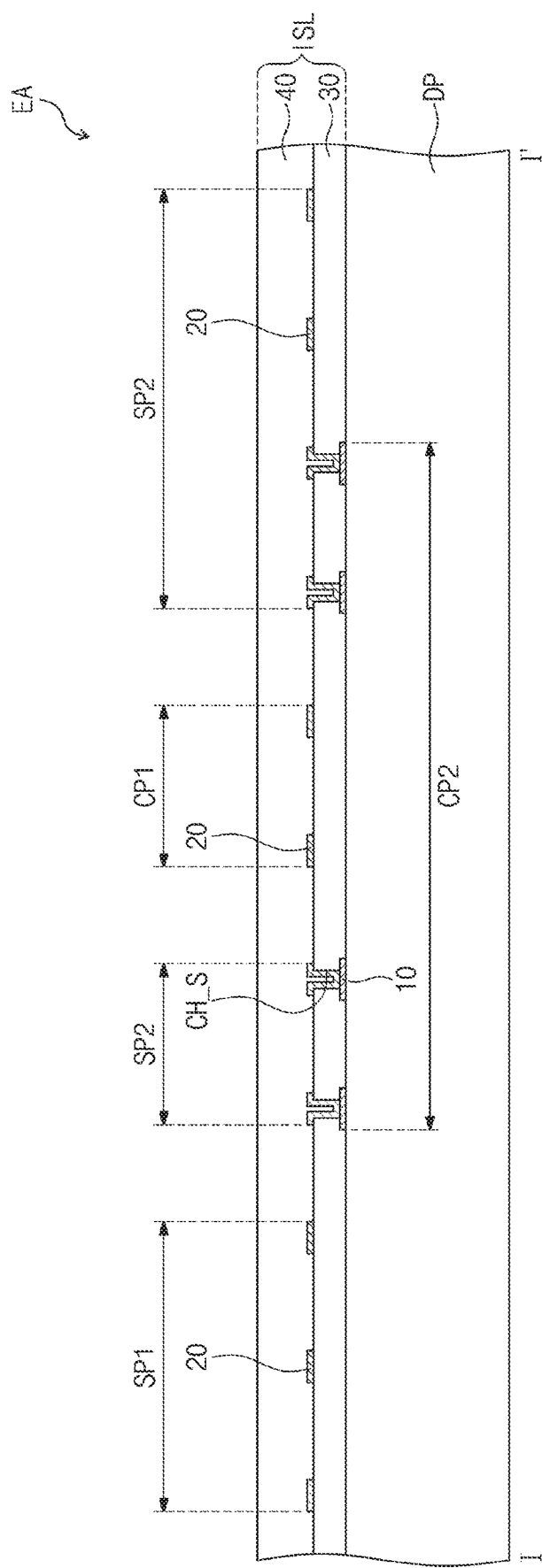

ELECTRONIC APPARATUS AND METHOD OF FABRICATING THE SAME

CROSS-REFERENCE TO RELATED APPLICATION

This application claims priority from and the benefit of Korean Patent Application No. 10-2017-0177442, filed on Dec. 21, 2017, which is hereby incorporated by reference for all purposes as if fully set forth herein.

BACKGROUND

Field

Exemplary implementations of the invention relate generally to an electronic apparatus and a method of fabricating the same, and in particular, to a method of fabricating an electronic apparatus with reduced defects and improved yield, as well as an electronic apparatus fabricated thereby.

Discussion of the Background

An electronic apparatus is activated by an electrical signal. The electronic apparatus includes a touch panel, which is configured to sense a variety of inputs to be applied from the outside. To improve a user's convenience, the touch panel may be used alone or in a display device for displaying an image.

The electronic apparatus includes a plurality of electrode patterns, which are used to deliver electrical signals for activating the electronic apparatus. In the case where electrode patterns on a specific region are activated, the region is used to display image information or to sense an external touch event.

During manufacture, an inspection step is performed to examine whether there is a failure or defects in the electronic apparatus. If a failure is found in the inspection step, a repair process is performed to allow the electronic apparatus to have a product quality available for purchase. The higher the success rate in the repair process, the higher the yield (productivity) in manufacture of the electronic apparatus.

The above information disclosed in this Background section is only for understanding of the background of the inventive concepts, and, therefore, it may contain information that does not constitute prior art.

SUMMARY

Devices according to and methods employing the principles and exemplary implementations of the invention are capable of increasing the yield in production of electronic apparatus by use of patterns that increase the visibility of the sensitive areas of the apparatus, such as the boundary between adjacent patterns of touch electrodes, thereby enabling inspection and repair of defects to focus on the most important areas of the apparatus.

Accordingly, exemplary implementation of the invention provide an electronic apparatus that facilitates identification and/or repair of defective areas, reduces process time, and improves manufacturing yield, and a method of fabricating the same.

Additional features of the inventive concepts will be set forth in the description which follows, and in part will be apparent from the description, or may be learned by practice of the inventive concepts.

According to one of more exemplary embodiments of the invention, an electronic apparatus includes: a first sensor pattern including having a first peripheral area extending in a first direction; a second sensor pattern spaced apart from the first sensor pattern and having a second peripheral area, the second peripheral area extending in the first direction and facing the first peripheral area in a second direction intersecting the first direction to form a boundary between the first and second sensor patterns; a first connection pattern connected to the first sensor pattern; a second connection pattern connected to the second sensor pattern, the first and second connection patterns being disposed on layers different from each other; and a first pattern overlapping the first peripheral area in a plan view and spaced apart from the second sensor pattern to increase visibility of the boundary, and wherein each of the first sensor pattern and the second sensor pattern includes a plurality of mesh lines defining a plurality of openings.

The first pattern and the first sensor pattern are disposed on the same layer.

The first pattern and the first sensor pattern may include the same material.

The mesh lines in the first sensor pattern define a plurality of openings, and the first pattern is overlapped with at least one of the openings of the first sensor pattern disposed in the first peripheral area and is opened toward the second peripheral area.

The first pattern is in contact with one of the mesh lines disposed in the first sensor pattern, and wherein the first pattern may overlap one of the mesh lines.

The first pattern and the first sensor pattern are disposed on different layers spaced apart from each other in a sectional view and overlapped with each other in a plan view.

the first sensor pattern, the second sensor pattern, and the first connection pattern may be disposed on a same layer, and the first pattern and the second connection pattern may be disposed on the same layer.

The mesh lines may include first mesh lines extending in the first direction, and second mesh lines extending in the second direction and intersect the first mesh lines, wherein the first peripheral area may include a line portion extending in the first direction, and a plurality of protruding portions connected to the line portion and spaced apart from each other in the first direction, wherein the line portion may be one of the first mesh lines, and wherein the protruding portions may be portions of the second mesh lines, which intersect the line portion and protrude from the line portion toward the second peripheral area.

The first pattern is disposed between adjacent protruding portions.

The first pattern may include a boundary pattern overlapped with the line portion, when viewed in a plan view.

The first pattern may include a boundary pattern overlapped with at least one of the protruding portions, when viewed in a plan view.

The first pattern may include a boundary pattern overlapped with at least one of regions where the line portion and the protruding portions intersects, when viewed in a plan view.

The electronic apparatus may further include a second pattern overlapping the second sensor pattern and spaced apart from the first sensor pattern.

The first pattern may include a plurality of first boundary patterns that are arranged along the first peripheral area, and the second pattern may include a plurality of second boundary patterns that are arranged along the second peripheral area.

The first boundary patterns and the second boundary patterns are alternately arranged in staggered fashion.

The first pattern has a decreasing width in a direction toward the second sensor pattern, when measured in the first direction.

The electronic apparatus may further include a dummy pattern disposed between the first sensor pattern and the second sensor pattern, the dummy pattern being electrically disconnected from the first sensor pattern and the second sensor pattern, and wherein the first pattern may be spaced apart from the dummy pattern.

The mesh lines in the first sensor pattern may define a plurality of openings, the first sensor pattern may further include at least one cut-away portion opening a side portion of at least one of the openings, and the at least one cut-away portion may be formed by cutting at least a portion of the mesh lines of the first sensor pattern.

The electronic apparatus may further include a display panel including a plurality of organic light emitting devices disposed in a plurality of light emitting regions, wherein the mesh lines may define a plurality of opens therein, and wherein the light emitting regions may be overlapped with the openings, when viewed in a plan view.

According to one or more exemplary embodiments of the invention, an electronic apparatus includes: a display panel including a plurality of light emitting regions; a first sensor pattern on the display panel; a second sensor pattern on the display panel and apart from the first sensor pattern; and a plurality of boundary patterns overlapping the first sensor pattern, and wherein each of the first and second sensor patterns includes mesh lines connected to each other to form a integral unit and the mesh lines define a plurality of openings overlapping the light emitting regions, and wherein the boundary patterns overlap at least a portion of the mesh lines of the first sensor pattern and are spaced apart from the mesh lines of the second sensor pattern.

The boundary patterns and the mesh lines of the first sensor pattern are disposed on a same layer.

A portion of the mesh lines of the first sensor pattern may be overlapped and with the boundary patterns, and the portion of the mesh lines and the boundary patterns may stacked each other.

The mesh lines of the first sensor pattern and the boundary patterns may include the same material.

The boundary patterns and the first sensor pattern are disposed on different layers, and the boundary patterns are spaced apart from the mesh lines of the first sensor pattern, when viewed in a sectional view.

According to one or more exemplary embodiments of the invention, a method of fabricating an electronic apparatus includes: providing an initial electronic panel having a first sensor pattern, a second sensor pattern spaced apart from the first sensor pattern, and a first boundary pattern overlapping with the first sensor pattern and spaced apart from each other the second sensor pattern; inspecting the initial electronic panel to locate defect patterns; determining whether any defect pattern requires repair based upon whether it is located in or adjacent to the first boundary pattern; and repairing at least one defective pattern located in or adjacent to the first boundary pattern to provide an electronic apparatus.

The defective pattern may include a conductive material.

The step of repairing the defective pattern may include dividing the defective pattern into two portions overlapped with the first and second sensor patterns, respectively.

The step of repairing of the defective pattern may include cutting the defective pattern along an imaginary line extending in a boundary region between the second sensor pattern and the first boundary pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 6A is a cross-section view taken along a sectional line I-I' of FIG. 5.

Figure 1:
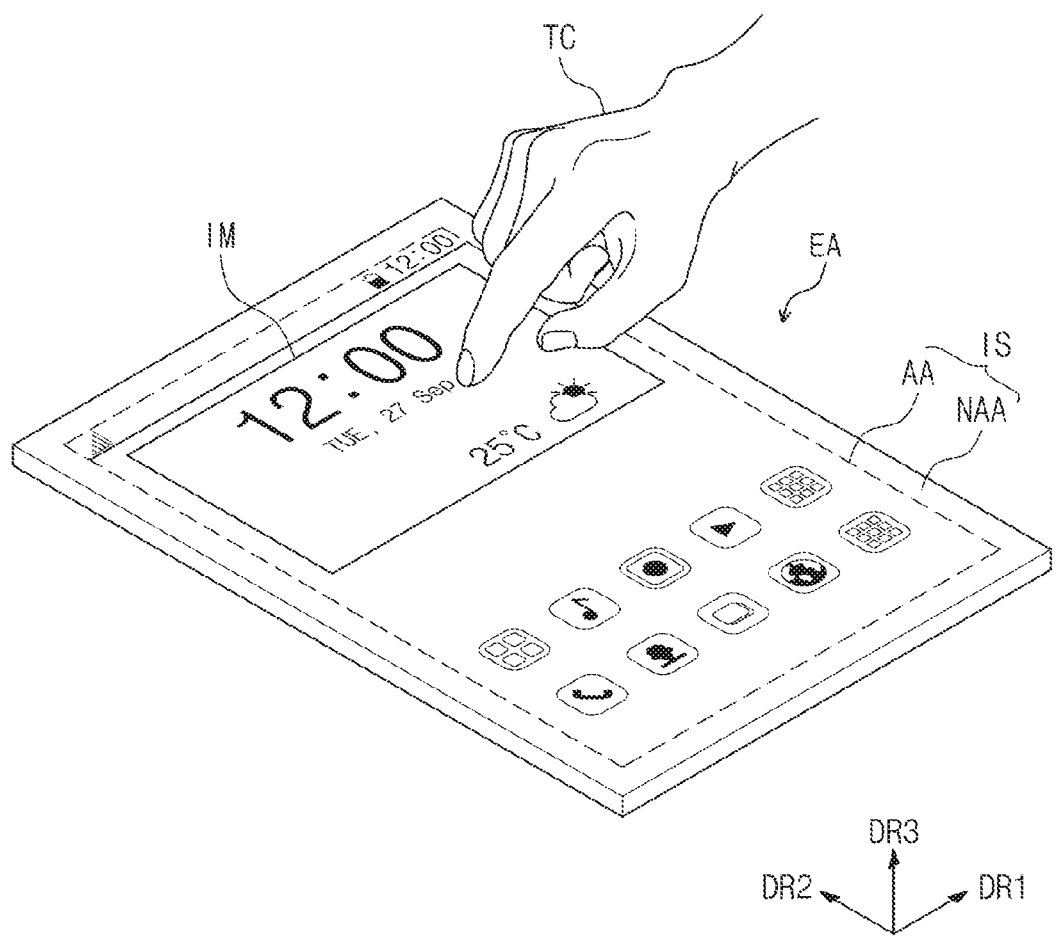
FIG. 1 is a perspective view illustrating an electronic apparatus constructed according to an exemplary embodiment of the invention.

It should be noted that these figures are intended to illustrate the general characteristics of methods, structure and/or materials utilized in certain example embodiments and to supplement the written description disposed below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various exemplary embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Example embodiments of the invention will now be described more fully with reference to the accompanying drawings, in which example embodiments are shown.

FIG. 1 is a perspective view illustrating an electronic apparatus constructed according to an exemplary embodiment of the invention. An electronic apparatus EA may be activated by an electrical signal applied thereto. The electronic apparatus EA may include a display surface IS, which is defined by a first direction DR1 and a second direction DR2 and is selectively activated by an electrical signal applied thereto. When viewed in a plan view, the display surface IS may be divided into an active region AA and a peripheral region NAA.

The active region AA may be a region that is electrically activated when an electrical signal is supplied thereto. According to the purpose of the electronic apparatus EA, the active region AA may be activated to perform various functions.

In an exemplary embodiment, the active region AA may be used as a sensing region of sensing an external input event. As shown in FIG. 1, the electronic apparatus EA may be configured to sense an external input TC to be applied to the active region AA. That is, the electronic apparatus EA may serve as an input device.

FIG. 1 illustrates an example in which a user's hand is used as the external input TC, but various external inputs may be used as the external input TC. For example, the external input may be disposed in various forms including a contact type touch (e.g., by a user's hand), a non-contact type touch, force, pressure, or light.

In addition, the active region AA may be a display region, which is configured to display information. The electronic apparatus EA may display an image IM on the active region AA, and the image IM may be used to provide information to a user. Accordingly, the electronic apparatus EA may be used as an output device.

The peripheral region NAA may be disposed adjacent to the active region AA. The peripheral region NAA may not be used to display an image or to sense an external input, even when the electronic apparatus EA is activated.

Signal lines for providing external signals to the active region AA or driving devices for driving the active region AA may be disposed in the peripheral region NAA. The peripheral region NAA may be located adjacent to one of edge regions of the active region AA.

In the illustrated embodiment, the peripheral region NAA is illustrated to have a frame shape surrounding the active region AA. However, the exemplary embodiments are not limited thereto, and in certain exemplary embodiments, the peripheral region NAA may be omitted from the electronic apparatus EA. The shape of the peripheral region NAA may be variously changed, and the exemplary embodiments are not limited to a specific shape of the peripheral region NAA.

FIG. 1 illustrates an example in which the electronic apparatus EA is a touch screen apparatus. However, the exemplary embodiments are not limited to this example, and the electronic apparatus EA may be configured to not have a display function.

FIGS. 2A, 2B, 2C, 2D, 2E, and 2F are cross-section views, each of which illustrates an electronic apparatus constructed according to an exemplary embodiment of the invention. FIGS. 2A, 2B, 2C, 2D, 2E, and 2F illustrate vertical sections, each of which is taken on a plane defined by the second and third directions DR2 and DR3. In FIGS. 2A, 2B, 2C, 2D, 2E, and 2F, various examples of the electronic apparatus EA are illustrated in a simplified manner in order to describe a stacking structure of a functional panel and/or functional units therein.

In an exemplary embodiment, the electronic apparatus EA may include a display panel, an input sensing unit, an anti-reflection unit, and a window unit. At least two of the display panel, the input sensing unit, the anti-reflection unit, and the window unit may be successively formed by a successive process or may be bonded to each other by an adhesive member. FIGS. 2A, 2B, 2C, 2D, 2E, and 2F illustrate examples in which a pressure sensitive adhesive film PSA is used as the adhesive member. In various exemplary embodiments to be described below, the adhesive member may be a typical adhesive material or a gluing agent, but the exemplary embodiments are not limited thereto. In an exemplary embodiment, the anti-reflection unit and an optical control unit may be replaced with other or may be omitted.

In FIGS. 2A, 2B, 2C, 2D, 2E, and 2F, if any one of the input-sensing unit, the anti-reflection unit, the optical control unit, or the window unit is formed on another element by a successive process, the unit will be expressed using a term "layer". By contrast, if any one of the input sensing unit, the anti-reflection unit, the optical control unit, or the window unit is bonded to another element by an adhesive member, the unit will be expressed using a term "panel". The unit expressed using the term "panel" may include a base layer (e.g., a synthetic resin film, a composite film, or a glass substrate) providing a base surface, but the unit expressed using the term "layer" may not have the base layer. In other words, the unit expressed using the term "layer" may be placed on a base surface that is disposed by another element or unit.

The input sensing unit, the anti-reflection unit, and the window unit may be referred to as an input sensing panel ISP, an anti-reflection panel RPP, and a window panel WP or to as an input sensing layer ISL, an anti-reflection layer RPL, and a window layer WL, according to the presence or absence of the base layer.

Figure 2A:
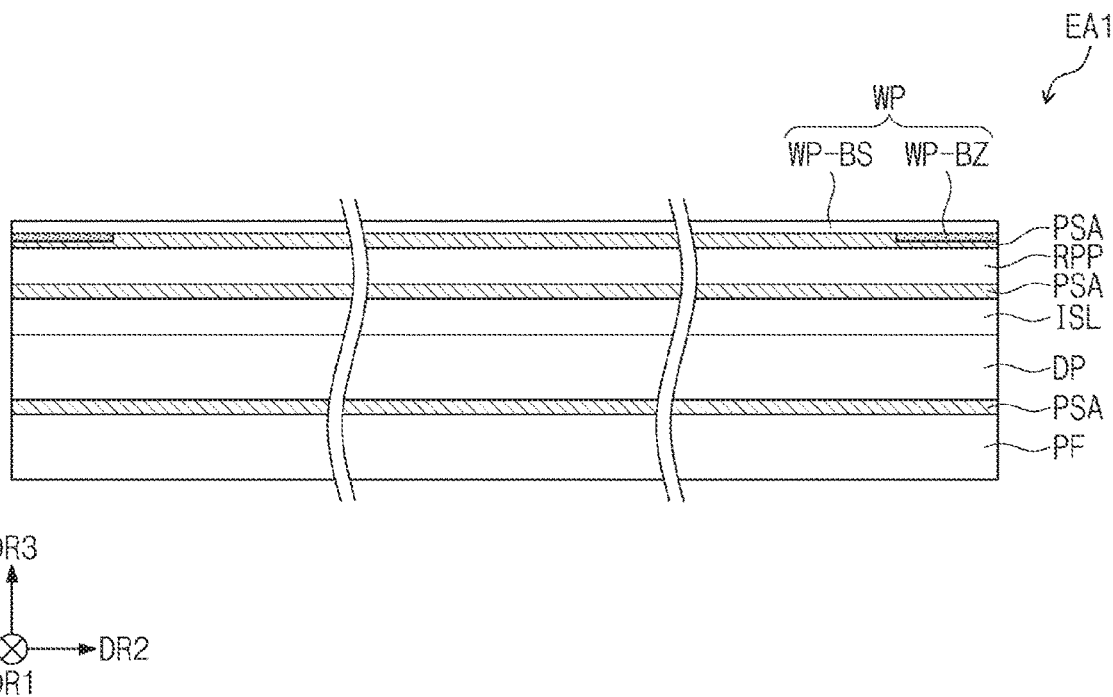
FIGS. 2A, 2B, 2C, 2D, 2E, and 2F are cross-section views, each of which illustrates an electronic apparatus constructed according to an exemplary embodiment of the invention.

As shown in FIG. 2A, an electronic apparatus EA1 may include a display panel DP, the input sensing layer ISL, the anti-reflection panel RPP, the window panel WP, and a protection member PF. The input sensing layer ISL may be directly disposed on the display panel DP. In the specification, the expression "an element B1 may be directly disposed on an element A1" may mean that an adhesive member is not disposed between the elements A1 and B1. After the formation of the element A1, the element B1 may be formed on a base surface, which is disposed by the element A1, through a successive process.

Pressure sensitive adhesive (PSA) films may be respectively disposed between the input sensing layer ISL and the anti-reflection panel RPP, between the anti-reflection panel RPP and the window panel WP, and between the display panel DP and the protection member PF.

The display panel DP may be configured to display the image IM (e.g., see FIG. 1), and the input sensing layer ISL may be configured to obtain information regarding coordinates of the external input TC (e.g., see FIG. 1). The protection member PF may be configured to support the display panel DP and to protect the display panel DP from an external impact.

The protection member PF may include a plastic film serving as a base layer. The protection member PF may include a plastic film containing one selected from the group consisting of thermoplastic resins (e.g., polyethylene terephthalate (PET), polyethylene (PE), polyvinylchloride (PVC), polypropylene (PP), polystyrene (PS), polyacrylonitrile (PAN), styrene-acrylonitrile copolymer (SAN), acrylonitrile-butadiene-styrene (ABS), polymethyl methacrylate (PMMA), and combinations thereof). In the case where the protection member PF is formed of polyethylene terephthalate (PET), it may be excellent in heat-resistant, fatigue strength, and electric characteristics and may be insensitive to temperature and humidity.

Materials for the protection member PF are not limited to plastic resins, and organic/inorganic composites may be used for the protection member PF. The protection member PF may include a porous organic layer and an inorganic material, which is formed to fill pores of the organic layer.

According to an exemplary embodiment of the invention, the display panel DP may be a light emitting type display panel, but the exemplary embodiments are not limited to a specific type of the display panel DP. For example, the display panel DP may be an organic light emitting display panel or a quantum dot light emitting display panel. A light emitting layer of the organic light emitting display panel may be formed of or include an organic luminescent material. A light emitting layer of the quantum dot light emitting display panel may include quantum dots and/or quantum rods. For the sake of simplicity, the description that follows will refer to an example in which the display panel DP is the organic light emitting display panel.

The anti-reflection panel RPP may be configured to reduce reflectance of a natural or solar light that is incident from an outer space to the window panel WP. In an exemplary embodiment, the anti-reflection panel RPP may include a phase retarder and a polarizer. The phase retarder may be of a film type or a liquid crystal coating type and may include a λ/2 and/or λ/4 phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection films thereof may be used as a base layer of the anti-reflection panel RPP.

In an exemplary embodiment, the anti-reflection panel RPP may include color filters. The color filters may be arranged in a specific manner. The arrangement of the color filters may be determined in consideration of colors of lights to be emitted from pixels in the display panel DP. The anti-reflection panel RPP may further include a black matrix disposed adjacent to the color filters.

In an exemplary embodiment, the window panel WP may include a base layer WP-BS and a light-blocking pattern WP-BZ. The base layer WP-BS may include a glass substrate and/or a synthetic resin film. The base layer WP-BS may not be limited to a single-layered structure. The base layer WP-BS may include two or more films that are bonded to each other by an adhesive member.

The light-blocking pattern WP-BZ may be partially overlapped with the base layer WP-BS. The light-blocking pattern WP-BZ may be disposed on the rear surface of the base layer WP-BS to define a bezel region of the electronic apparatus EA (e.g., the peripheral region NAA of FIG. 1).

The light-blocking pattern WP-BZ may be a colored organic layer and may be formed by, for example, a coating method. Although not shown, the window panel WP may further include a functional coating layer disposed on the front surface of the base layer WP-BS. The functional coating layer may include an anti-fingerprint layer, an anti-reflection layer, a hard coating layer, and so forth.

In FIGS. 2B, 2C, 2D, 2E, and 2F, the window panel WP and the window layer WL are briefly illustrated without distinction between the base layer WP-BS and the light-blocking pattern WP-BZ.

Figure 2B:
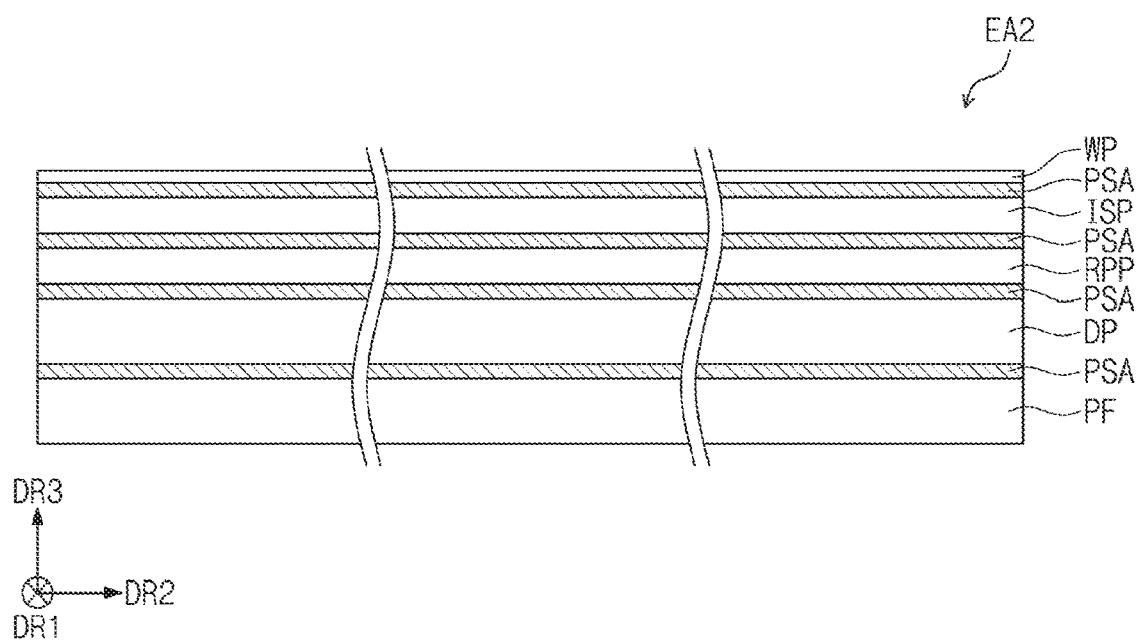
Figure 2C:
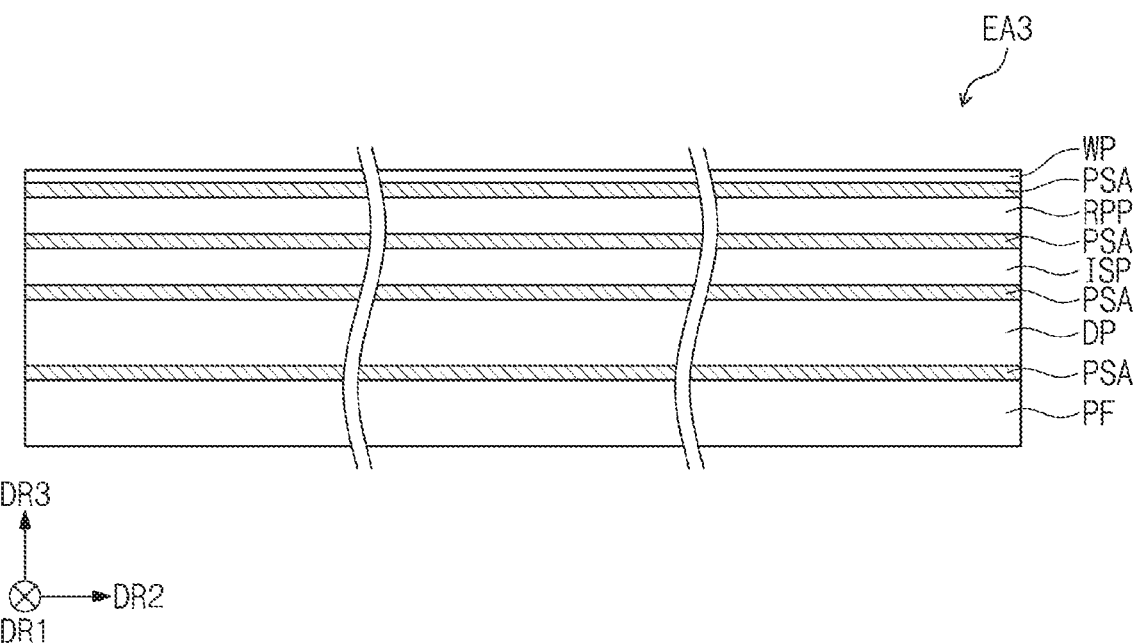

As shown in FIGS. 2B and 2C, an electronic apparatus EA2 or EA3 may include the protection member PF, the display panel DP, the input sensing panel ISP, the anti-reflection panel RPP, and the window panel WP. The stacking order of the input sensing panel ISP and the anti-reflection panel RPP may be changed.

Figure 2D:
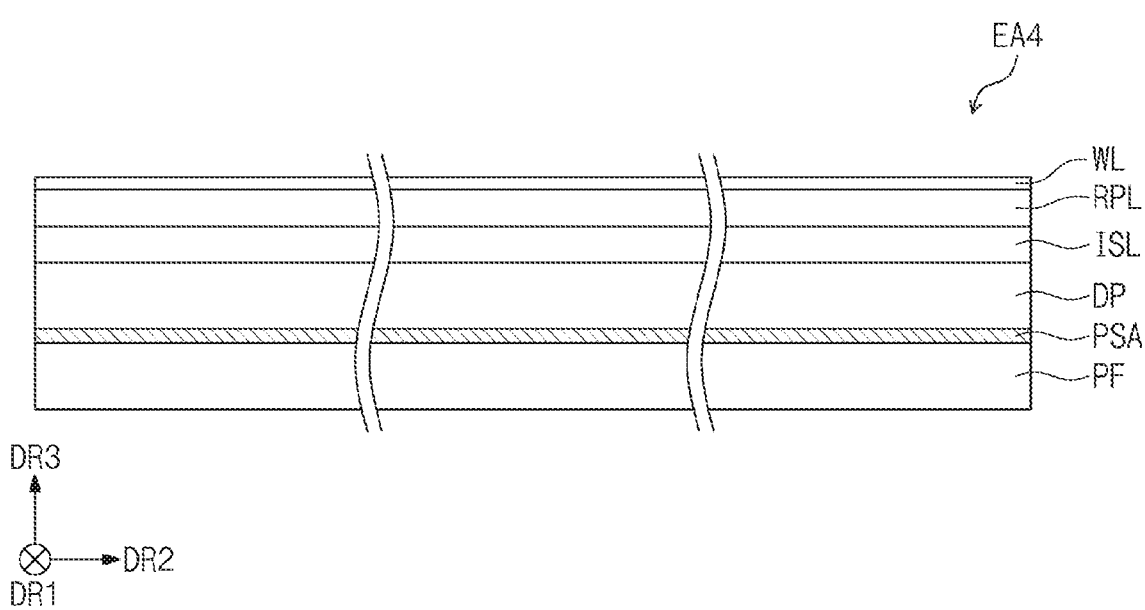

As shown in FIG. 2D, an electronic apparatus EA4 may include the protection member PF, the display panel DP, the input sensing layer ISL, the anti-reflection layer RPL, and the window layer WL. Adhesive members may be omitted from the electronic apparatus EA4, and the input sensing layer ISL, the anti-reflection layer RPL, and the window layer WL may be formed on a base surface, which is disposed by the display panel DP, by a successive process. The stacking order of the input sensing layer ISL and the anti-reflection layer RPL may be changed.

Here, the anti-reflection layer RPL may include a liquid crystal coating type phase retarder and a liquid crystal coating type polarizer. The phase retarder and the polarizer may include a discotic liquid crystal layer having a tilt angle in a specific direction.

Figure 2E:
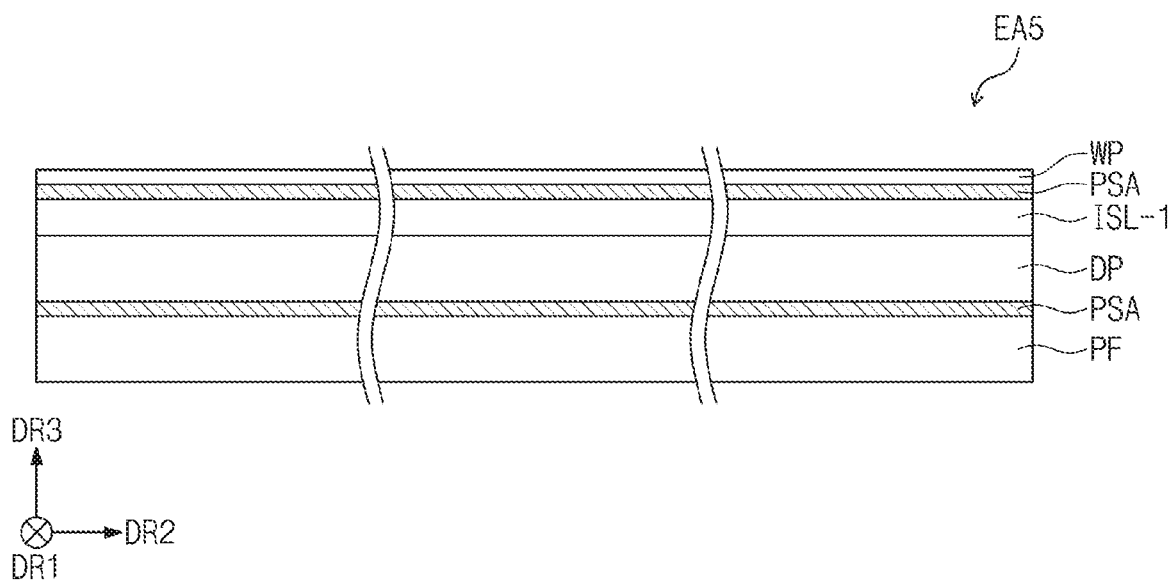
Figure 2F:
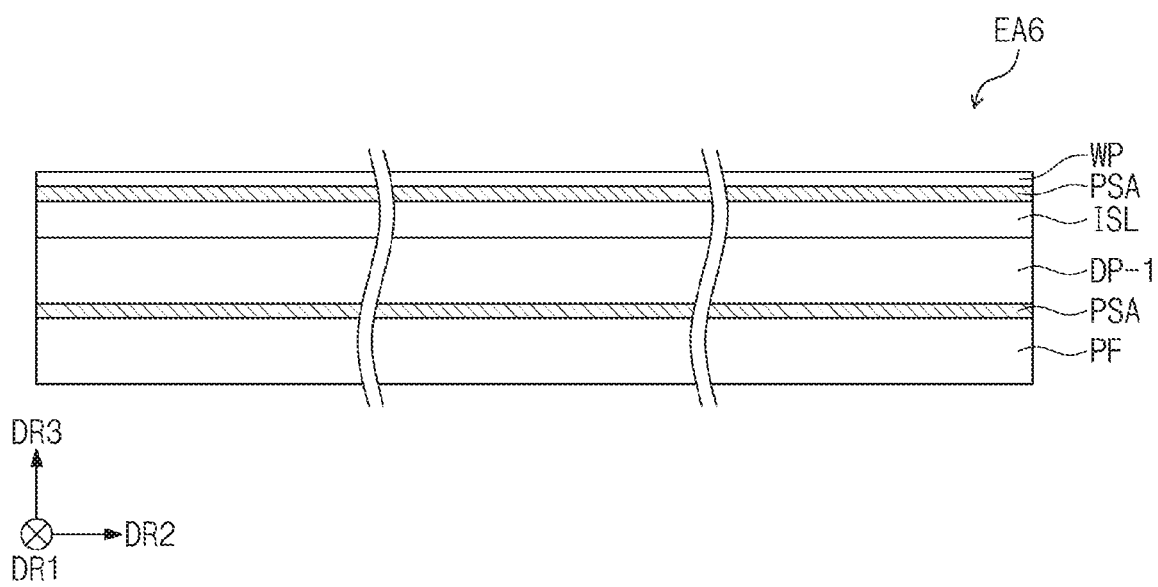

As shown in FIGS. 2E and 2F, an electronic apparatus EA5 or EA6 may not include an additional anti-reflection layer. Compared to the input sensing panel ISP or the input sensing layer ISL shown in FIGS. 2A, 2B, 2C, and 2D, an input sensing layer ISL-1 shown in FIG. 2E may further include a color filter having an anti-reflection function. Unlike the display panel DP shown in FIGS. 2A, 2B, 2C, and 2D, a display panel DP-1 of FIG. 2F may further include a color filter having an anti-reflection function.

Figure 3:
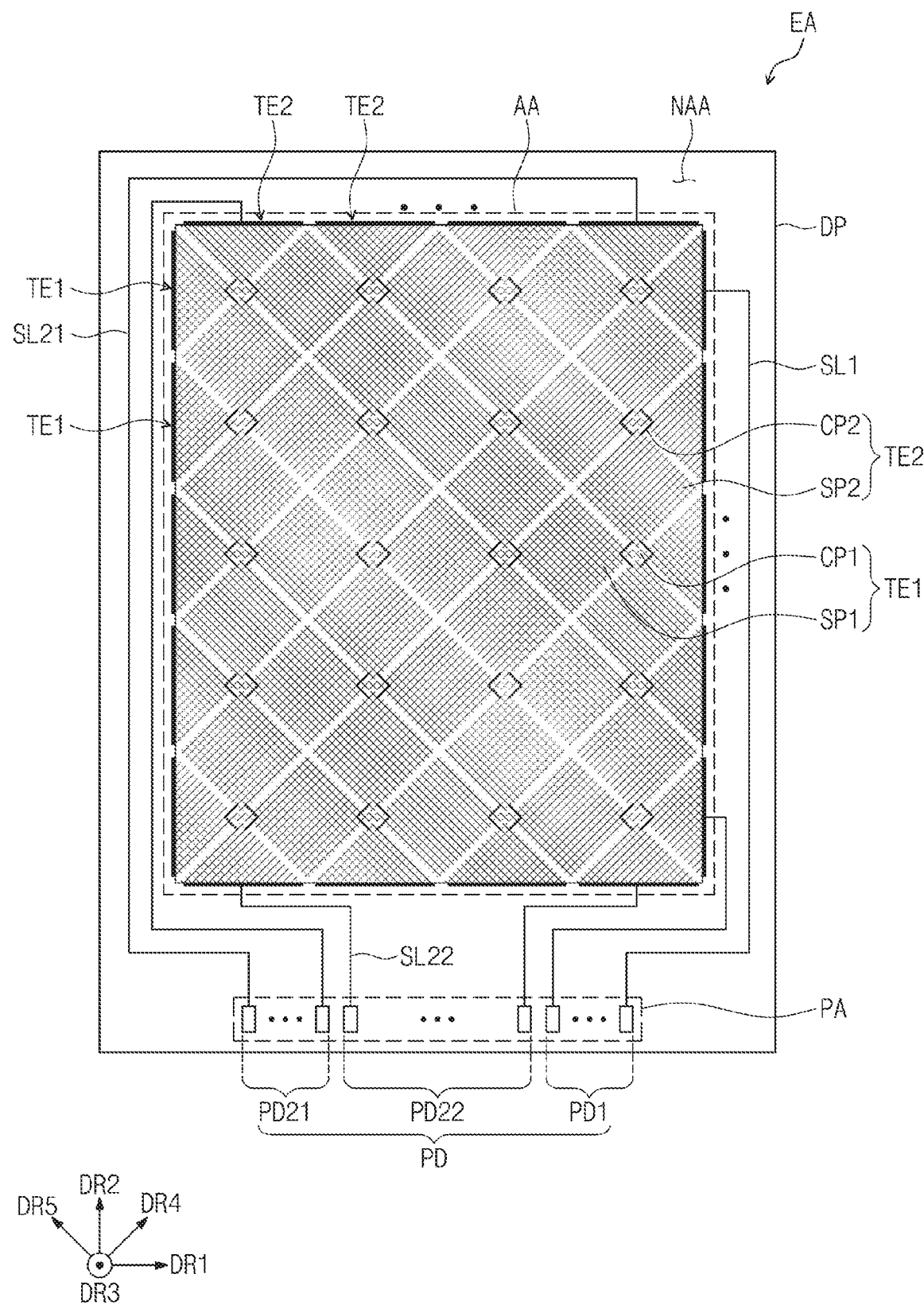
FIG. 3 is a plan view schematically illustrating an electronic apparatus constructed according to an exemplary embodiment of the invention.
Figure 4:
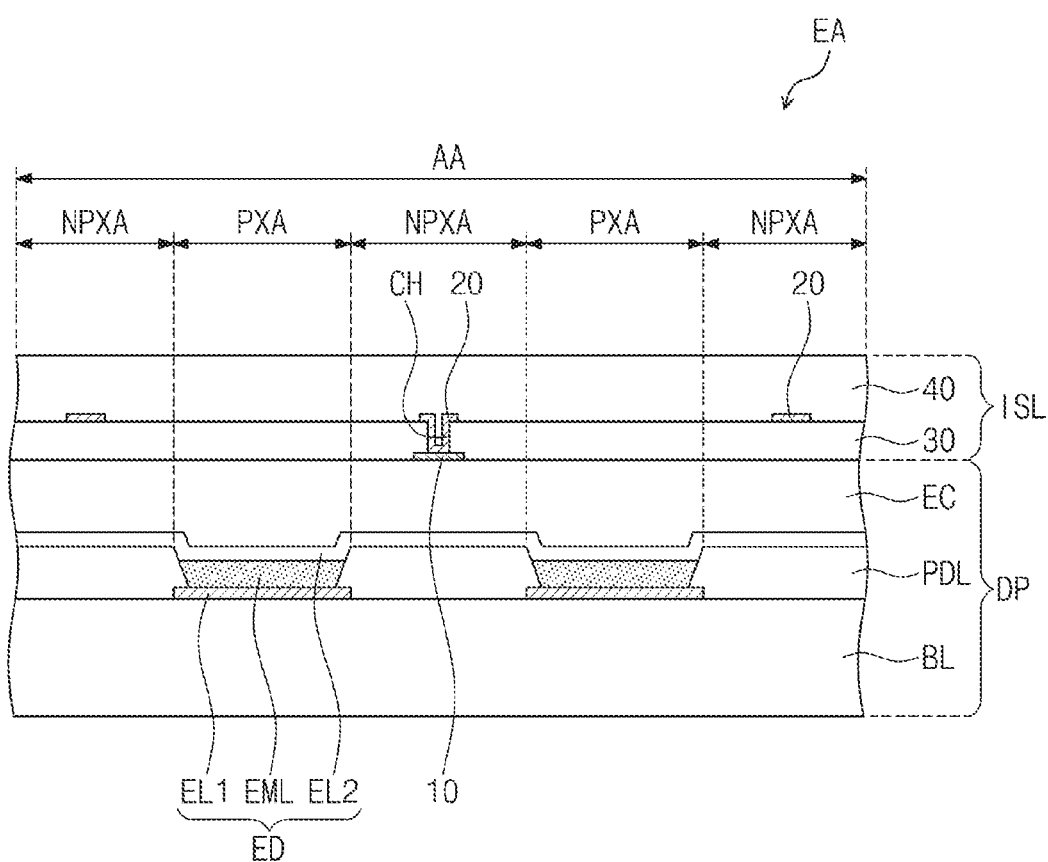
FIG. 4 is a cross-section view illustrating a region of the electronic apparatus of FIG. 3.

FIG. 3 is a plan view schematically illustrating an electronic apparatus constructed according to an exemplary embodiment of the invention. FIG. 4 is a cross-section view illustrating a region of the electronic apparatus of FIG. 3. For convenience in illustration, a part of the electronic apparatus (e.g., the display panel DP and the input sensing layer ISL) is illustrated in FIGS. 3 and 4, and a region of the active region AA is illustrated in FIG. 4. Hereinafter, an exemplary embodiment of the inventive concept will be described with reference to FIGS. 3 and 4.

In an exemplary embodiment, the input sensing layer ISL is illustrated to be disposed on the display panel DP. However, the exemplary embodiments are not limited to this example, and in certain exemplary embodiments, the input sensing layer ISL may be disposed below or in the display panel. The position of the input sensing layer ISL may be variously changed, and the exemplary embodiments are not limited to a specific position of the input sensing layer ISL.

Referring to FIG. 4, the display panel DP may include a base layer BL, a pixel definition layer PDL, a display device ED, and an encapsulation layer EC. The display panel DP may include a plurality of light emitting regions PXA and a plurality of non-light emitting regions NPXA, which are arranged in the active region AA. Although only two regions of the light emitting regions PXA are illustrated in FIG. 4, the exemplary embodiments are not limited thereto.

The base layer BL may include a plurality of insulating layers and a plurality of conductive layers. The conductive layers and the insulating layers may be disposed to constitute a thin-film transistor and a capacitor, which are connected to the display device ED.

The pixel definition layer PDL may be disposed on the base layer BL. Openings may be defined in the pixel definition layer PDL. The openings may be formed to define the light emitting regions PXA, respectively.

The display devices ED may be disposed on the base layer BL. The display devices ED may be disposed at positions corresponding to the openings, respectively. The display device ED may be configured to emit light and thereby to display an image, based on electrical signals to be transmitted thereto through the base layer BL constituting the thin-film transistor and the capacitor.

The display device ED may be realized in various forms. For example, the display device ED may be an electrophoretic device, a liquid crystal capacitor, an electrowetting device, or an organic light emitting device. The description that follows will refer to an example in which the display device ED is an organic light emitting device.

The display device ED may include a first electrode EL1, a light emitting layer EML, and a second electrode EL2. In the display device ED, a potential difference between the first electrode EL1 and the second electrode EL2 may be adjusted to activate the light emitting layer EML or to allow the light emitting layer EML to emit light. Thus, the light emitting regions PXA may correspond to regions, on which the light emitting layers EML are disposed.

The light emitting regions PXA may have at least two different sizes or areas. For example, the area of each of the light emitting regions PXA may be determined based on color of light emitted therefrom. In the case where the light emitting region is configured to have an area suitable for its color, it may be possible to realize uniform optical efficiency to various colors.

The encapsulation layer EC may be disposed to cover the display device ED. The encapsulation layer EC may include at least one inorganic layer and/or at least one organic layer. The encapsulation layer EC may be configured to prevent moisture from infiltrating into the display device ED and to protect the display device ED. In addition, the encapsulation layer EC may be disposed between the display device ED and the input sensing layer ISL to electrically separate the display device ED from the input sensing layer ISL. However, the exemplary embodiments are not limited to this example, and in certain exemplary embodiments, the encapsulation layer EC may be disposed in the form of a glass substrate or a plastic substrate. In this case, a space between the encapsulation layer EC and the display device ED may be filled with an inert or inactive gas. The structure of the display panel DP may be variously changed, and the exemplary embodiments are not limited to a specific structure of the display panel DP.

The input sensing layer ISL may be directly disposed on the encapsulation layer EC. For example, the input sensing layer ISL may be directly deposited on a top surface of the encapsulation layer EC and then may be patterned. However, the exemplary embodiments are not limited to this example, and in certain exemplary embodiments, the electronic apparatus EA may further include another element (e.g., a color filter or a buffer layer), which is interposed between the input sensing layer ISL and the encapsulation layer EC.

Referring to FIG. 3, the input sensing layer ISL may include a first sensing electrode TE1, a second sensing electrode TE2, a first signal line SL1, second signal lines SL21 and SL22, and a pad PD. The first sensing electrode TE1, the second sensing electrode TE2, the first signal line SL1, the second signal lines SL21 and SL22, and the pad PD, may include conductive patterns, respectively.

The first sensing electrode TE1 may extend in the first direction DR1. In an exemplary embodiment, a plurality of the first sensing electrodes TE1 may be arranged in the second direction DR2. Each of the first sensing electrodes TE1 may include a plurality of first sensor patterns SP1, which are arranged in the first direction DR1, and first connection patterns CP1, each of which is disposed between the first sensor patterns SP1 and is used to connect an adjacent pair of the first sensor patterns SP1 to each other.

The second sensing electrode TE2 may be electrically disconnected from the first sensing electrode TE1. The second sensing electrode TE2 may extend in the second direction DR2. In an exemplary embodiment, a plurality of the second sensing electrodes TE2 may be arranged in the first direction DR1. Each of the second sensing electrodes TE2 may include a plurality of second sensor patterns SP2, which are arranged in the second direction DR2, and second connection patterns CP2, each of which is disposed between the second sensor patterns SP2 and is used to connect an adjacent pair of the second sensor patterns SP2 to each other.

The input sensing layer ISL may be used to sense a change in mutual capacitance between the first and second sensing electrodes TE1 and TE2 or a change in self capacitance of each of the first and second sensing electrodes TE1 and TE2, thereby sensing the external input TC (e.g., see FIG. 1). The method of sensing the external input TC using the input sensing layer ISL may be variously changed, as the exemplary embodiments are not limited to a specific method.

The first signal line SL1 may be connected to the first sensing electrode TE1. The first signal line SL1 may be disposed in the peripheral region NAA and may not be recognized by a user. The second signal lines SL21 and SL22 may be connected to the second sensing electrode TE2. The second signal lines SL21 and SL22 may be disposed in the peripheral region NAA and may not be recognized by a user.

In an exemplary embodiment, the second signal lines SL21 and SL22 may include an upper signal line SL21 and a lower signal line SL22. The upper signal line SL21 may be connected to an upper portion of the second sensing electrode TE2, and the lower signal line SL22 may be connected to a lower portion of the second sensing electrode TE2. The upper signal line SL21 and the lower signal line SL22 may be respectively connected to a plurality of pads PD21 and PD22 spaced apart from each other. Thus, even when the second sensing electrode TE2 is longer than the first sensing electrode TE1, it may be possible to uniformly apply an electrical signal to the entire region of the active region AA. Accordingly, regardless of the shape of the input sensing layer ISL, it may be possible to provide a uniform touch sensing environment throughout the entire region of the active region AA.

However, the exemplary embodiments are not limited thereto. As an example, opposite ends of the first sensing electrode TE1 may also be connected to a pair of signal lines. As another example, an end of each the first and second sensing electrodes TE1 and TE2 may be connected to a signal line. Furthermore, the input sensing layer ISL may be operated in various manners, but the exemplary embodiments are not limited to a specific operation method.

The pads PD may include a first pad PD1 and second pads PD21 and PD22. As described above, each of the pads PD may be electrically connected to the first sensing electrode TE1 or the second sensing electrode TE2 through a corresponding one of the first signal line SL1 or the second signal lines SL21 and SL22. Electrical signals from the outside may be applied to the input sensing layer ISL through the pads PD.

Referring back to FIG. 4, the input sensing layer ISL may include a plurality of conductive layers and a plurality of insulating layers, which are stacked on the base layer BL. In an exemplary embodiment, the input sensing layer ISL may include a first conductive layer 10, a second conductive layer 20, a first insulating layer 30, and a second insulating layer 40, disposed on different layers.

the first conductive layer 10 may be disposed on the display panel DP. The second conductive layer 20 may be disposed on the first conductive layer 10. Each of the first sensing electrode TE1, the second sensing electrode TE2, the first signal line SL1, the second signal lines SL21 and SL22, and the pads PD may be included in one of the first and second conductive layers 10 and 20.

Each of the first and second conductive layers 10 and 20 may include a plurality of conductive patterns. The conductive patterns may include the first sensing electrode TE1, the second sensing electrode TE2, the first signal line SL1, the second signal lines SL21 and SL22, and the pads PD described above.

The conductive patterns constituting each of the first and second conductive layers 10 and 20 may not be overlapped with the light emitting regions PXA, when viewed in a plan view. In this case, even if the first and second conductive layers 10 and 20 are formed of an opaque material or have large areas, it may be possible to prevent the first and second conductive layers 10 and 20 from affecting the image IM displayed on the light emitting regions PXA. However, the exemplary embodiments are not limited to this example, and each of the first and second conductive layers 10 and 20 may include a conductive pattern that is overlapped with at least a portion of the light emitting regions PXA.

The first insulating layer 30 may be disposed between the first and second conductive layers 10 and 20. When viewed in a sectional view, the first insulating layer 30 may be disposed to separate the first conductive layer 10 from the second conductive layer 20. The first and second conductive layers 10 and 20 may be electrically connected to each other through a contact hole CH, which is formed to penetrate the first insulating layer 30.

The second insulating layer 40 may be disposed on the first insulating layer 30. The second insulating layer 40 may cover the second conductive layer 20. The second insulating layer 40 may protect the second conductive layer 20 from an external environment.

The first and second insulating layers 30 and 40 may have an insulating property and an optically transparent property. Accordingly, even when the light emitting region PXA is covered by the first and second insulating layers 30 and 40, light from the light emitting region PXA may be recognized by a user located outside the input sensing layer ISL.

Each of the first and second insulating layers 30 and 40 may include at least one of inorganic and organic layers. In the case where the first and second insulating layers 30 and 40 are substantially formed of organic materials, it may be possible to improve flexibility of the input sensing layer ISL. Alternatively, in the case where the first and second insulating layers 30 and 40 are substantially formed of inorganic materials, the input sensing layer ISL may be disposed to have a thin structure and an improved impact resistance property. In an exemplary embodiment, various materials may be used for the first and second insulating layers 30 and 40, as the exemplary embodiments are not limited to specific materials.

Figure 5:
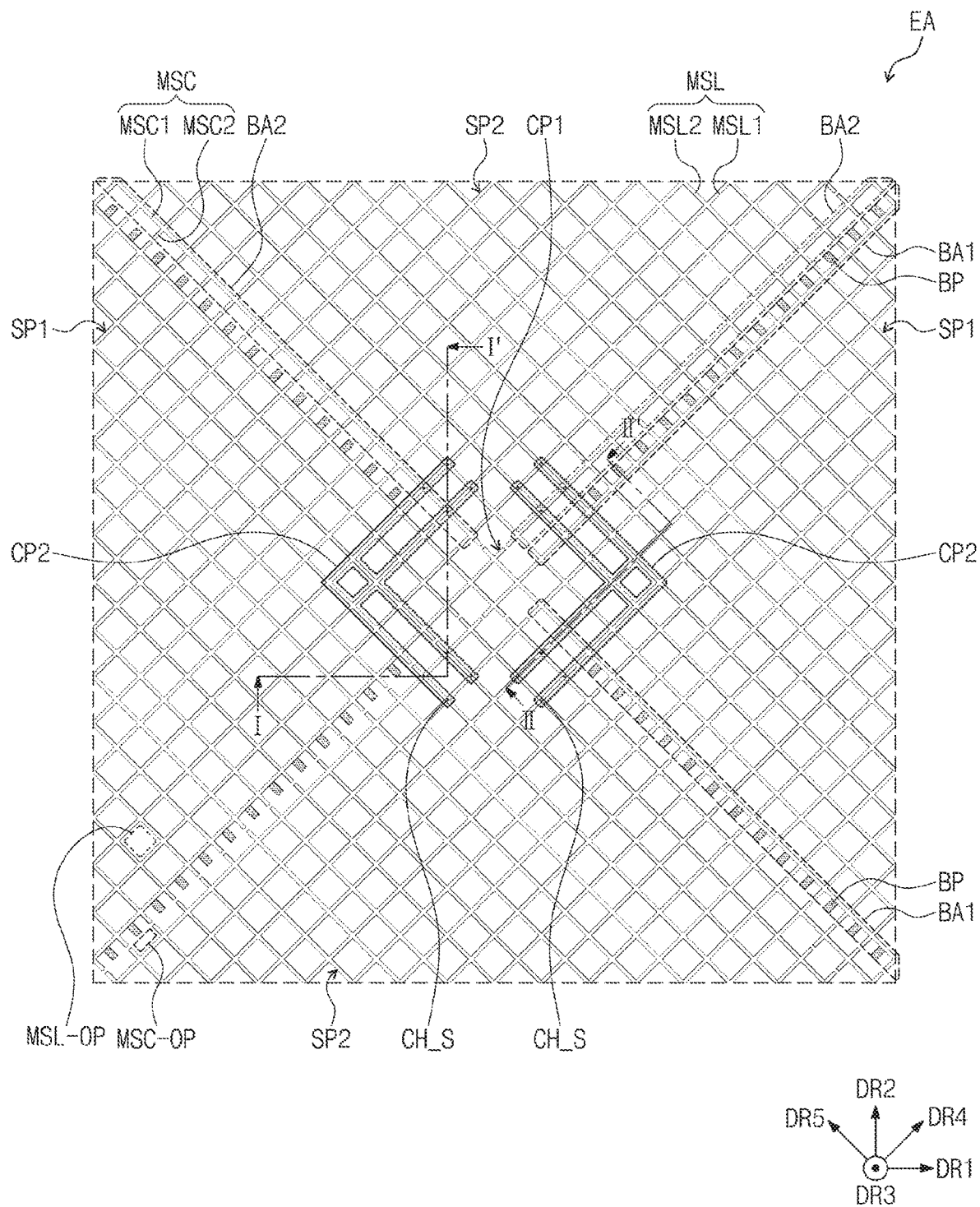
FIG. 5 is an enlarged plan view illustrating a representative region of the electronic apparatus of FIG. 3.
Figure 6B:
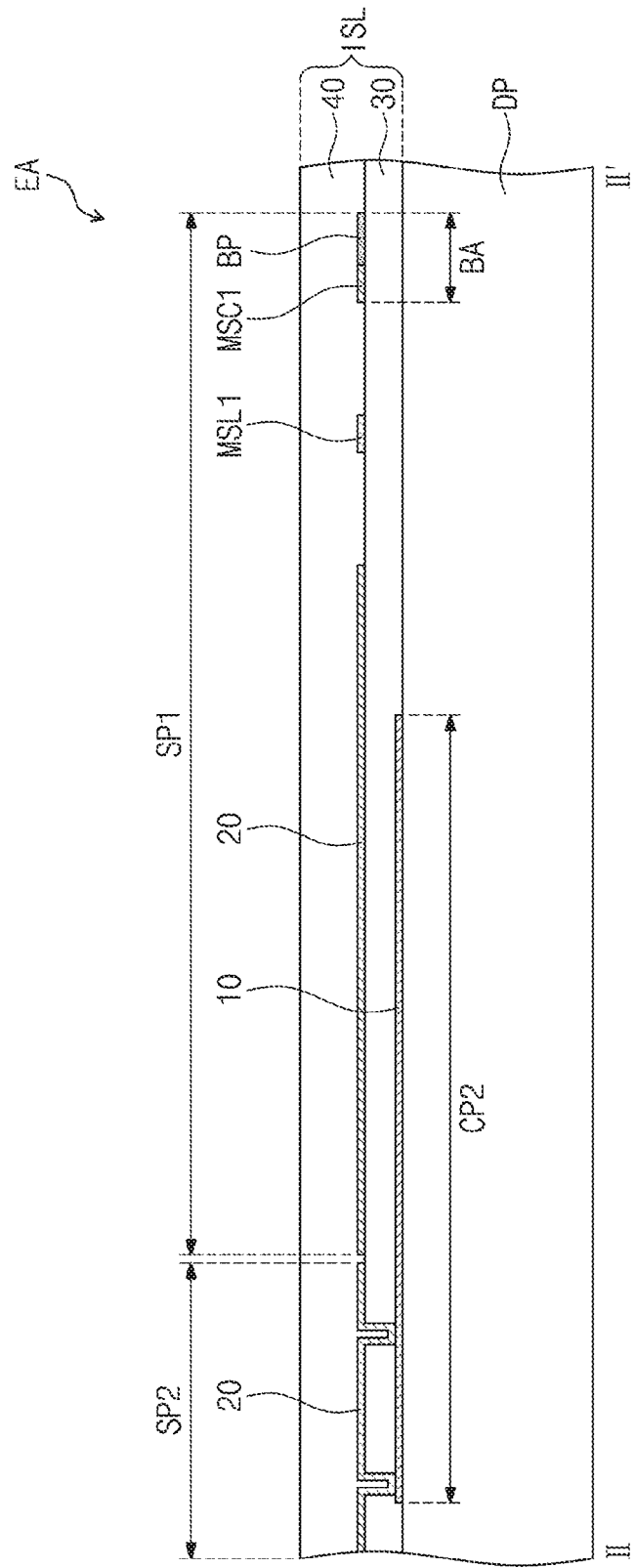
FIG. 6B is a cross-section view taken along a sectional line of FIG. 5.
Figure 6C:
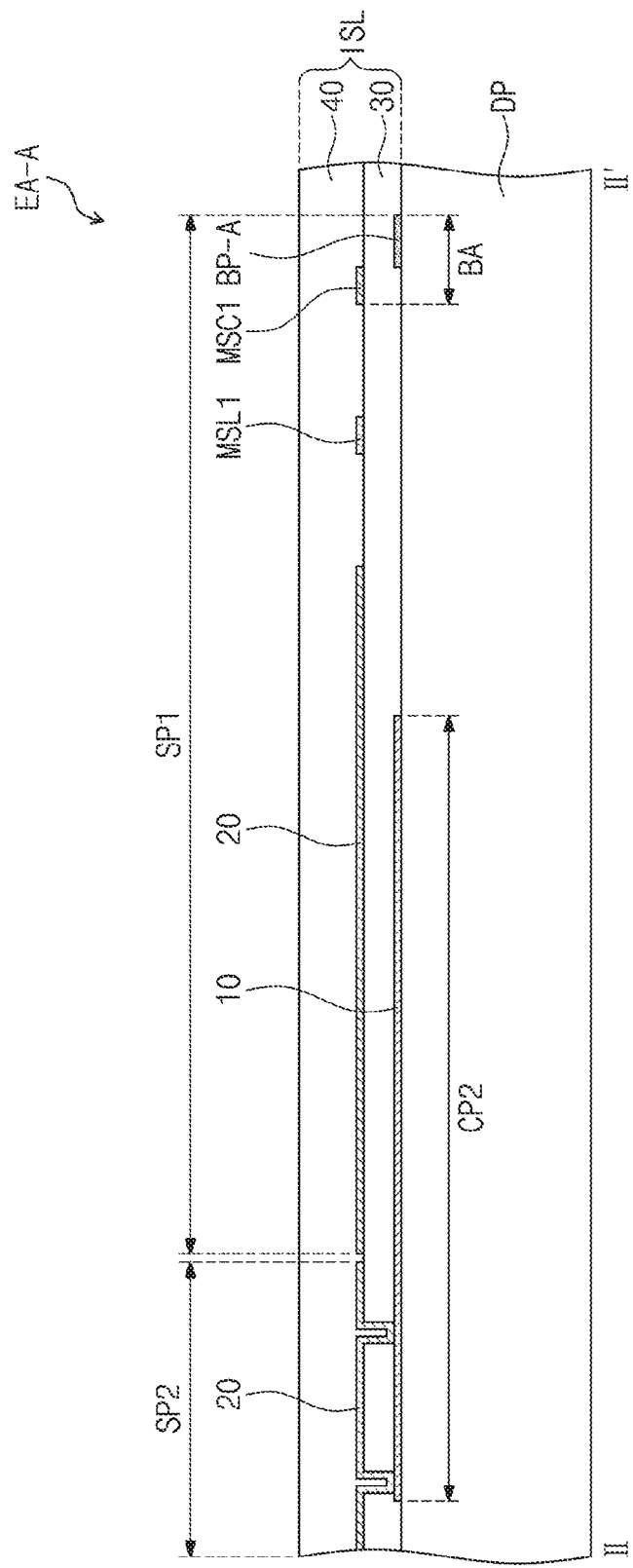
FIG. 6C is a cross-section view illustrating a portion of an electronic apparatus constructed according to an exemplary embodiment of the invention.

FIG. 5 is an enlarged plan view illustrating a representative region of the electronic apparatus of FIG. 3. FIG. 6A is a sectional view taken along line I-I' of FIG. 5. FIG. 6B is a sectional view taken along line II-II' of FIG. 5. FIG. 6C is a sectional view illustrating a portion of an electronic apparatus constructed according to an exemplary embodiment of the invention. For convenience in illustration, FIG. 5 illustrates a region, in which the first and second connection patterns CP1 and CP2 of the input sensing layer ISL are disposed. In particular, only conductive patterns are illustrated in FIG. 5, and the first and second insulating layers 30 and 40 are omitted. Furthermore, for convenience in illustration, FIG. 6C illustrates a region corresponding to FIG. 6B. Hereinafter, exemplary embodiments of the invention will be described with reference to FIGS. 5, 6A, 6B, and 6C.

As shown in FIG. 5, the first sensor patterns SP1 may be spaced apart from each other in the first direction DR1 with the first and second connection patterns CP1 and CP2 in the center, and the second sensor patterns SP2 may be spaced apart from each other in the second direction DR2 with the first and second connection patterns CP1 and CP2 in the center.

The first connection pattern CP1 may be extended in the first direction DR1 to connect the first sensor patterns SP1 to each other, and the second connection pattern CP2 may be extended in the second direction DR2 to connect the second sensor patterns SP2 to each other. The first connection pattern CP1 and the second connection pattern CP2 may be formed on different layers.

In an exemplary embodiment, each of the first sensor patterns SP1, the second sensor patterns SP2, and the first connection pattern CP1 may include a plurality of mesh lines MSL. The mesh lines MSL may include a first mesh line MSL1 extending in a fourth direction DR4 and a second mesh line MSL2 extending in a fifth direction DR5 intersecting the first mesh line MSL1, e.g. at right angles.

The first mesh line MSL1 and the second mesh line MSL2 may be disposed on the same layer and may be connected to each other to form a plurality of mesh openings MSL-OP. Each of the mesh openings MSL-OP may be overlapped with the light emitting region PXA (e.g., see FIG. 4). Each of the conductive patterns shown in FIG. 4 may be a corresponding one of the mesh lines MSL.

Referring to FIGS. 5, 6A, 6B, and 6C, the first sensor patterns SP1, the second sensor patterns SP2, and the first connection pattern CP1 may be disposed on the second connection pattern CP2. For example, the first sensor patterns SP1, the second sensor patterns SP2, and the first connection pattern CP1 may be disposed between the first and second insulating layers 30 and 40, and the second connection pattern CP2 may be disposed between the display panel DP and the first insulating layer 30.

The first sensor patterns SP1, the second sensor patterns SP2, and the first connection pattern CP1 may be included in the second conductive layer 20. Each of the first sensor patterns SP1, the second sensor patterns SP2, and the first connection pattern CP1 may be composed of the mesh lines MSL. The first connection pattern CP1 and the first sensor patterns SP1 may be connected to each other to form a single object.

The second connection pattern CP2 may be included in the first conductive layer 10. The second connection pattern CP2 may be composed of the mesh lines MSL or a transparent pattern. The second connection pattern CP2 and the second sensor patterns SP2 may be disposed on different layers and may be connected to each other through a contact hole CH S.

In certain exemplary embodiments, the second connection pattern CP2 and the second sensor patterns SP2 may be disposed on the same layer. In this case, the first and second sensor patterns SP1 and SP2 may be disposed on different layers, and the second connection pattern CP2 and the second sensor patterns SP2 may be connected to each other to form a single object.

The second connection pattern CP2 may be overlapped with a portion of the first sensor patterns SP1, when viewed in a plan view. However, the exemplary embodiments are not limited to this example, and for example, a portion of the first sensor pattern SP1 overlapped with the second connection pattern CP2 may be removed. In this case, it is possible to reduce noise, which may occur when a parasitic capacitor is formed between the second connection pattern CP2 and the first sensor patterns SP1.

In an exemplary embodiment, the input sensing layer ISL may further include a boundary pattern BP. The boundary pattern BP may be overlapped with the first sensor patterns SP1, when viewed in a plan view. The boundary pattern BP may be disposed on a peripheral area BA1 of one of the first sensor patterns SP1.

The peripheral area BA1 of the first sensor pattern SP1 (hereinafter, boundary area BA1 of the first sensor pattern SP1) may constitute a peripheral portion of each of the first sensor patterns SP1. The boundary area BA1 of the first sensor pattern SP1 may correspond to side portions of the first sensor patterns SP1 facing each of the second sensor patterns SP2 at the boundary region between the first and second sensor patterns. Thus, the boundary area BA1 of the first sensor pattern SP1 may extend in the fourth direction DR4 or the fifth direction DR5, according to positions of the side portions of each of the first sensor patterns SP1.

The boundary area BA1 of the first sensor pattern SP1 may be defined by the outermost mesh lines, which are located adjacent to the second sensor patterns SP2 and are ones of the mesh lines MSL constituting the first sensor patterns SP1, and may include a cut mesh portion MSC. The cut mesh portion MSC may include a line portion MSC1, which is extended in an extension direction of the boundary area BA1 of the first sensor pattern SP1, and a plurality of protruding portions MSC2, which are disposed to cross the line portion MSC1 and to protrude outward from the line portion MSC1.

The line portion MSC1 may be a line-shaped pattern extending substantially parallel to the boundary area BA1 of the first sensor pattern SP1. The line portion MSC1 may be one of the first mesh lines MSL1 or one of the second mesh lines MSL2.

The protruding portions MSC2 may be extended in a direction, which is not parallel to the extension direction of the boundary area BA1 of the first sensor pattern SP1, and may be arranged to be spaced apart from each other in the extension direction of the boundary area BA1 of the first sensor pattern SP1. End portions of the protruding portions MSC2 may be connected to the line portion MSC1, and other end portions of the protruding portions MSC2 may be disposed to face an adjacent one of the second sensor patterns. The protruding portions MSC2 may be some of the first and second mesh lines MSL1 and MSL2, which are disposed to cross the line portion MSC1, and may be end portions protruding from the line portion MSC1.

For example, in the case where the boundary area BA1 of the first sensor pattern SP1 extends in the fourth direction DR4, the line portion MSC1 may correspond to one of the first mesh lines MSL1 extending in the fourth direction DR4, and the protruding portions MSC2 may correspond to portions of the second mesh lines MSL2 extending in the fifth direction DR5. Alternatively, in the case where the boundary area BA1 of the first sensor pattern SP1 extends in the fifth direction DR5, the line portion MSC1 may correspond to one of the second mesh lines MSL2 extending in the fifth direction DR5, and the protruding portions MSC2 may correspond to portions of the first mesh lines MSL1 extending in the fourth direction DR4.

The line portion MSC1 and the protruding portions MSC2 may be connected to each other to form openings MSC-OP. Each of the openings MSC-OP may have a shape that is opened toward the second sensor patterns SP2. Each of the openings MSC-OP may have a shape that is formed by removing at least one of four mesh lines defining each of the mesh openings MSL-OP.

A peripheral area BA2 of the second sensor pattern SP2 may have a shape corresponding to the boundary area BA1 of the first sensor pattern SP1. For example, the peripheral area BA2 of the second sensor pattern SP2 (hereinafter, boundary area BA2 of the second sensor pattern SP2) may be defined by the outermost mesh lines, which are located adjacent to the first sensor patterns SP1 and are ones of the mesh lines MSL constituting the second sensor patterns SP2, and may include a cut mesh portion MSC. The cut mesh portion MSC may include the line portion MSC1, which is extended in the extension direction of the boundary area BA2 of the second sensor pattern SP2, and a plurality of the protruding portions MSC2, which are disposed to cross the line portion MSC1 and to protrude outward from the line portion MSC1. Hereinafter, for the sake of simplicity, the description that follows will refer to an example in which the boundary pattern BP is disposed in the boundary area BA1 of the first sensor pattern SP1, but the exemplary embodiments are not limited thereto. For example, the second sensor pattern SP2 and the boundary area BA2 of the second sensor pattern SP2 may also be disposed to have structures and shapes corresponding to the first sensor pattern SP1 and the boundary area BA1 of the first sensor pattern SP1, but the exemplary embodiments are not limited thereto.

In an exemplary embodiment, the boundary pattern BP may be disposed in the opening MSC-OP. Thus, the boundary pattern BP may be spaced apart from the protruding portions MSC2. As shown in FIG. 5, the boundary patterns BP may be disposed in the openings MSC-OP, respectively, and may not be disposed at intersection regions of the first and second connection patterns CP1 and CP2. However, the exemplary embodiments are not limited to this example, and for example, the boundary patterns BP may be disposed in only some of the openings MSC-OP or may be disposed at the intersection regions of the first and second connection patterns CP1 and CP2.

Referring to FIG. 6B, the boundary pattern BP may constitute the second conductive layer 20. In other words, the boundary pattern BP may be disposed between the first and second insulating layers 30 and 40 and may be disposed on the same layer as that on which the first sensor patterns SP1, the second sensor patterns SP2, and the first connection pattern CP1 are disposed. The boundary pattern BP may be overlapped with the first sensor patterns SP1 and may be disposed adjacent to the line portion MSC1.

The boundary pattern BP, the first sensor patterns SP1, the second sensor patterns SP2, and the first connection pattern CP1 may be formed of the same material and may be simultaneously formed by a patterning process using a single mask. Thus, it may be possible to easily form the boundary pattern BP, without an additional process. However, the exemplary embodiments are not limited to this example, and in certain exemplary embodiments, the boundary pattern BP may be formed of a material different from the first sensor patterns SP1, the second sensor patterns SP2, and the first connection pattern CP1 or may be formed at different times by separate processes.

In FIG. 6B, the boundary pattern BP is in contact with the line portion MSC1. However, the exemplary embodiments are not limited to this example, and the boundary pattern BP may be spaced apart from the line portion MSC1 by a specific distance and may have a reduced length in the fifth direction DR5. If the boundary pattern BP is disposed in the boundary area BA1 of the first sensor pattern SP1, the disposition and shape of the boundary pattern BP may be variously changed.

Referring to FIG. 6C, in an electronic apparatus EA-A according to an exemplary embodiment of the inventive concept, a boundary pattern BP-A may constitute the first conductive layer 10. That is, the boundary pattern BP-A may be disposed between the display panel DP and the first insulating layer 30 and may be disposed on the same layer as that on which the second connection pattern CP2 is disposed. The boundary pattern BP-A and the second connection pattern CP2 may be formed on the same material and may be simultaneously formed by a patterning process using a single mask. Thus, it may be possible to easily form the boundary pattern BP-A, without an additional process. However, the exemplary embodiments are not limited to this example, and in certain exemplary embodiments, the boundary pattern BP-A and the second connection pattern CP2 may be formed of different materials or may be formed at different times by separate processes.

The boundary pattern BP-A may be overlapped with the first sensor patterns SP1, when viewed in a plan view, but the boundary pattern BP-A and the first sensor patterns SP1 may be disposed on two layers different from each other. For example, in the case where, when viewed in a plan view, the boundary pattern BP-A is disposed at the same position as the boundary pattern BP of FIG. 6A, the boundary pattern BP-A may be separated from or in contact with the line portion MSC1, when viewed in a sectional view. If, when viewed in a plan view, the boundary pattern BP or BP-A is overlapped with the first sensor patterns SP1, the exemplary embodiments are not limited to a specific arrangement of the boundary pattern BP or BP-A.

In an exemplary embodiment, the boundary pattern BP or BP-A may be disposed in the boundary area BA2 of the second sensor pattern SP2 to be overlapped with the second sensor patterns SP2 and may be disposed in the boundary area BA1 of the first sensor pattern SP1 and the boundary area BA2 of the second sensor pattern SP2, respectively. However, the exemplary embodiments are not limited to these examples.

According to an exemplary embodiment of the invention, the electronic apparatus EA or EA-A may include the boundary pattern BP or BP-A, which is disposed in the boundary area BA1 of the first sensor pattern SP1. The boundary pattern BP or BP-A may be allow a boundary disposed between peripheral portions of the first and second sensor patterns SP1 and SP2 to be easily recognized among the mesh lines MSL. Thus, increased visibility of the boundary between electrically isolated sensor patterns reduces the time and effort required identify and perform a process of repairing the electronic apparatus EA or EA-A and to decrease production defects and increase manufacturing yield. This will be described in more detail below.

Figure 7A:
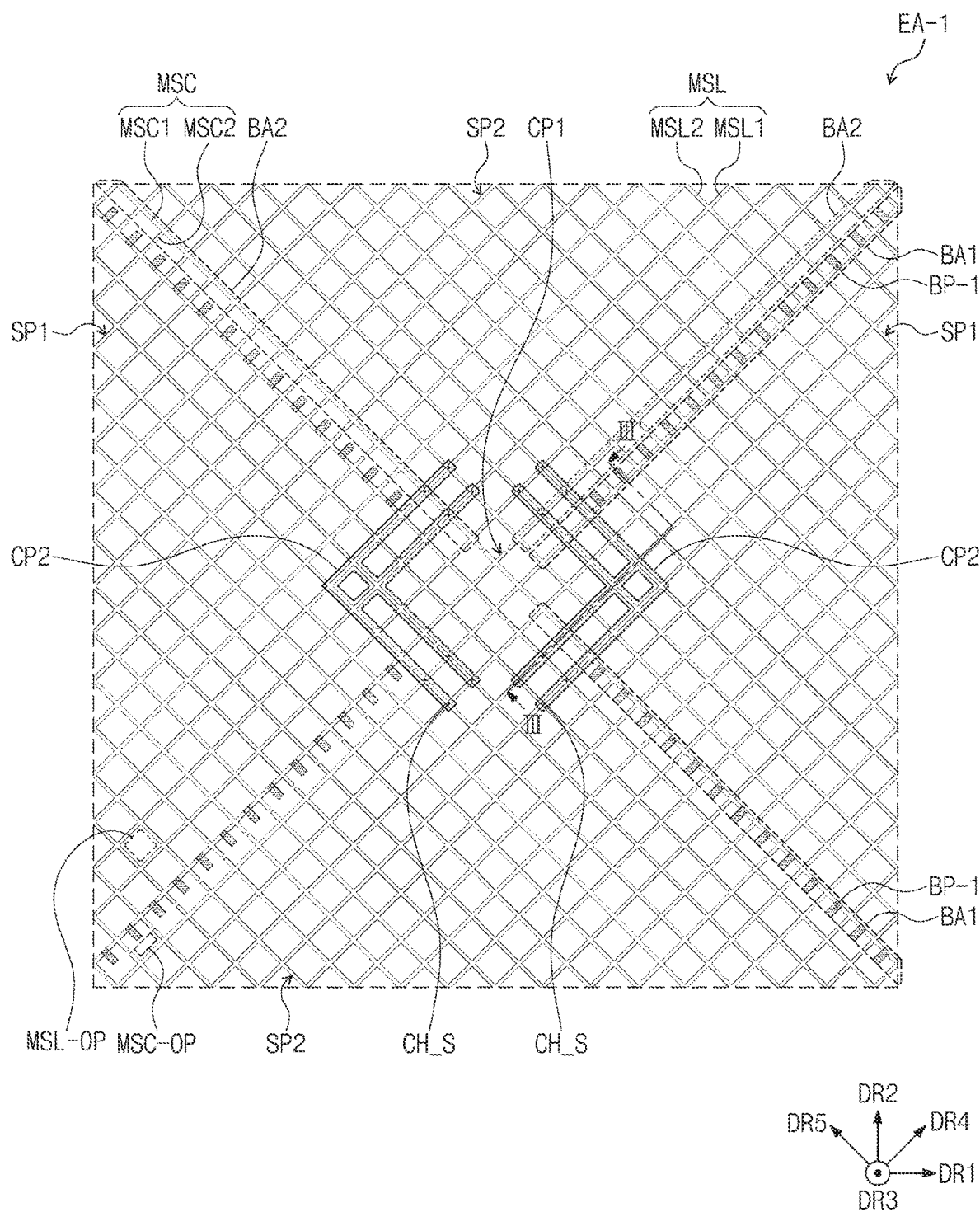
FIG. 7A is a plan view illustrating a portion of an electronic apparatus constructed according to an exemplary embodiment of the invention.
Figure 7B:
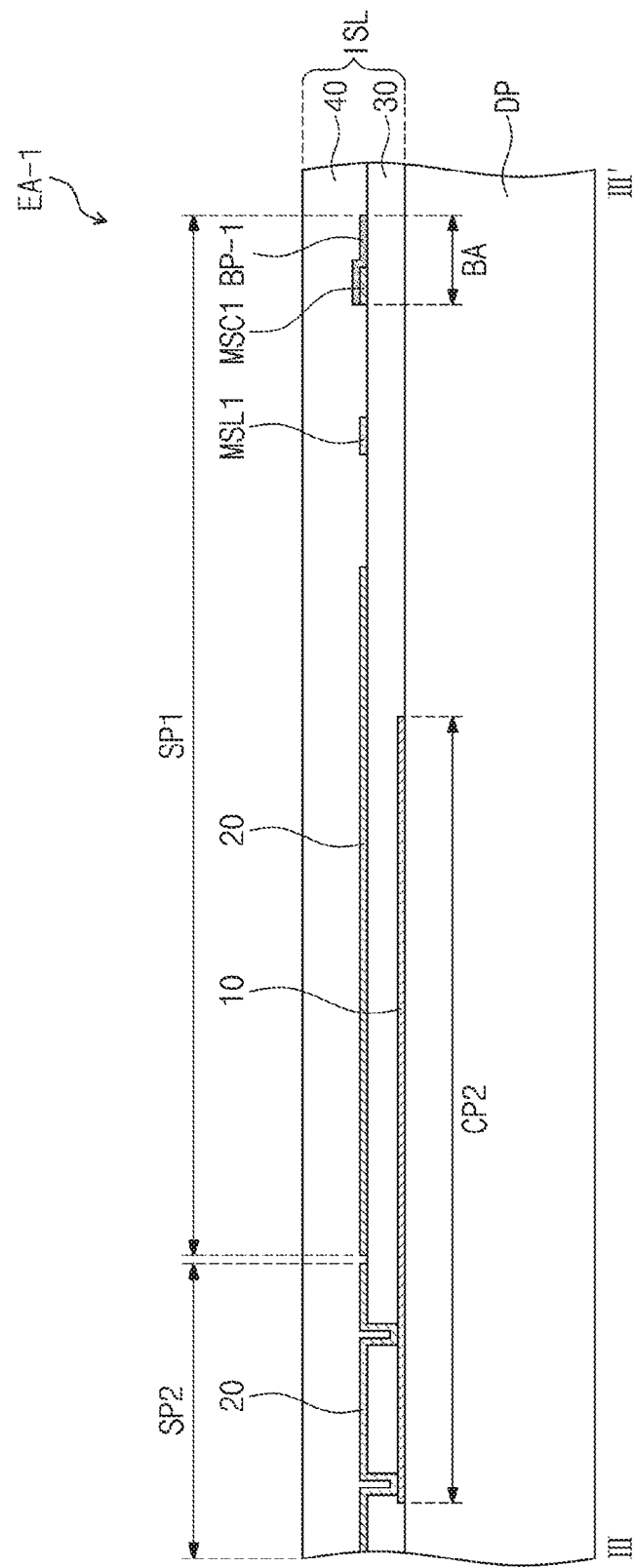
FIG. 7B is a cross-section view taken along a sectional line of FIG. 7A.
Figure 7C:
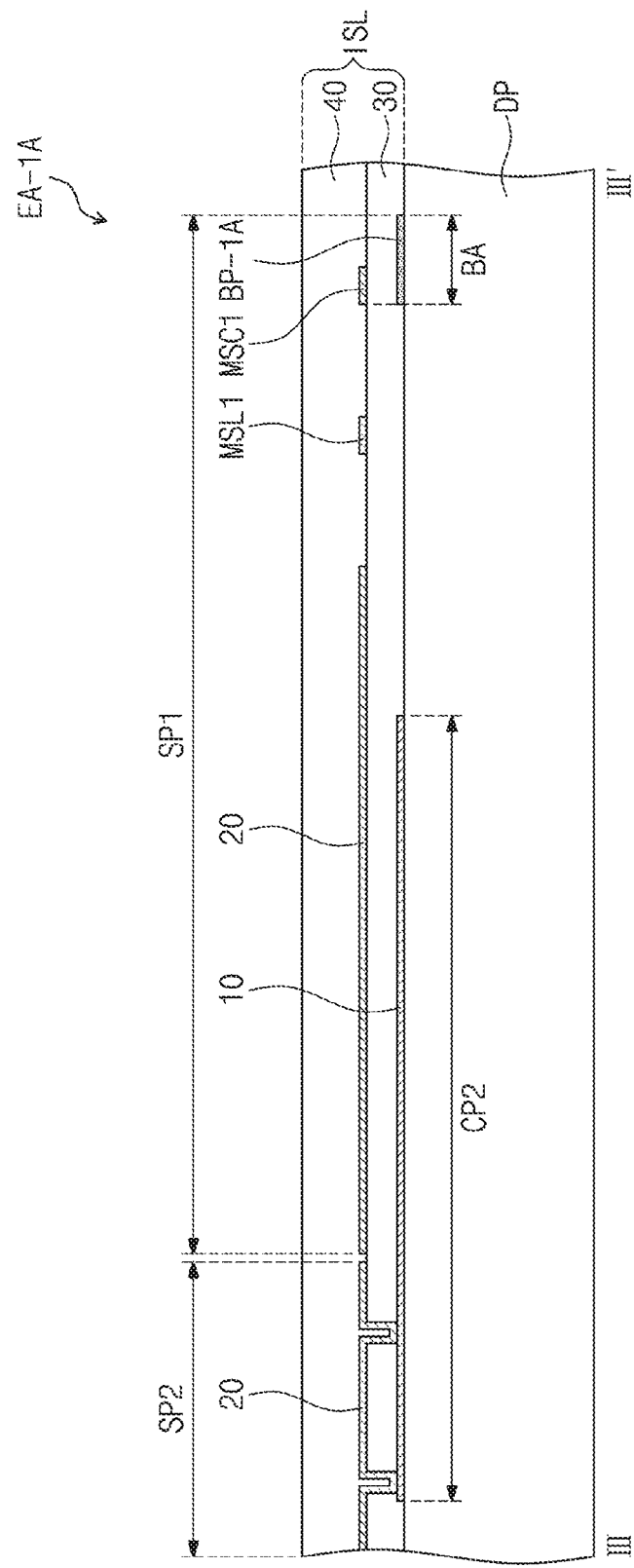
FIG. 7C is a cross-section view illustrating a portion of an electronic apparatus constructed according to an exemplary embodiment of the invention.

FIG. 7A is a plan view illustrating a portion of an electronic apparatus constructed according to an exemplary embodiment of the invention. FIG. 7B is a cross-section view taken along sectional line of FIG. 7A. FIG. 7C is a cross-section view illustrating a portion of an electronic apparatus constructed according to an exemplary embodiment of the invention. For convenience in illustration, FIG. 7A illustrates a region corresponding to FIG. 5, and FIG. 7C illustrates a region corresponding to FIG. 7B. Hereinafter, an exemplary embodiment of the invention will be described with reference to FIGS. 7A, 7B, and 7C. For concise description, an element previously described with reference to FIGS. 1, 2A, 2B, 2C, 2D, 2E, 2F, 3, 4, 5, 6A, 6B, and 6C may be identified by the same reference number without repeating a redundant description thereof.

As shown in FIG. 7A, an electronic apparatus EA-1 may include a boundary pattern BP-1, which is overlapped with at least one of the mesh lines MSL when viewed in a plan view. The boundary pattern BP-1 may be disposed in the boundary area BA1 of the first sensor pattern SP1 and may be overlapped with at least a portion of the cut mesh portion MSC, when viewed in a plan view.

As shown in FIG. 7B, the boundary pattern BP-1 may be included in the second conductive layer 20. Thus, a portion of the boundary pattern BP-1 may be disposed on the same layer as that on which the first sensor patterns SP1, the second sensor patterns SP2, and the first connection pattern CP1 are disposed. Here, the boundary pattern BP-1 may be disposed on the same layer as that on which the line portion MSC1 of the cut mesh portion MSC is disposed, to cover at least a portion of the line portion MSC1. The boundary pattern BP-1 may be in contact with the first insulating layer 30 and the line portion MSC1.

In certain exemplary embodiments, as shown in FIG. 7C, an electronic apparatus EA1-A may include a boundary pattern BP-1A included in the first conductive layer 10. Thus, the boundary pattern BP-1A and the second connection pattern CP2 may be formed on the same layer.

The boundary pattern BP-1A may be overlapped with the line portion MSC1 of the cut mesh portion MSC, when viewed in a plan view, and the boundary pattern BP-1A and the line portion MSC1 may be disposed on different layers. Thus, in the case where, when viewed in a plan view, the boundary pattern BP-1A is disposed at the same position as the boundary pattern BP-1 of FIG. 7B, the boundary pattern BP-1A may be overlapped with, but spaced apart from, the line portion MSC1, when viewed in a sectional view.

According to an exemplary embodiment of the invention, the boundary pattern BP-1 or BP-1A may be overlapped with the line portion MSC1, when viewed in a plan view, and thus, the boundary area BA1 of the first sensor pattern SP1 may be easily recognized from the mesh lines MSL. Thus, a boundary between the second sensor patterns SP2 and the first sensor patterns SP1 may be easily distinguished, and, which, as discussed above, reduces the time and effort required to identify and perform a repair process, decreases production of defects and increases manufacturing yield.

Figure 8A:
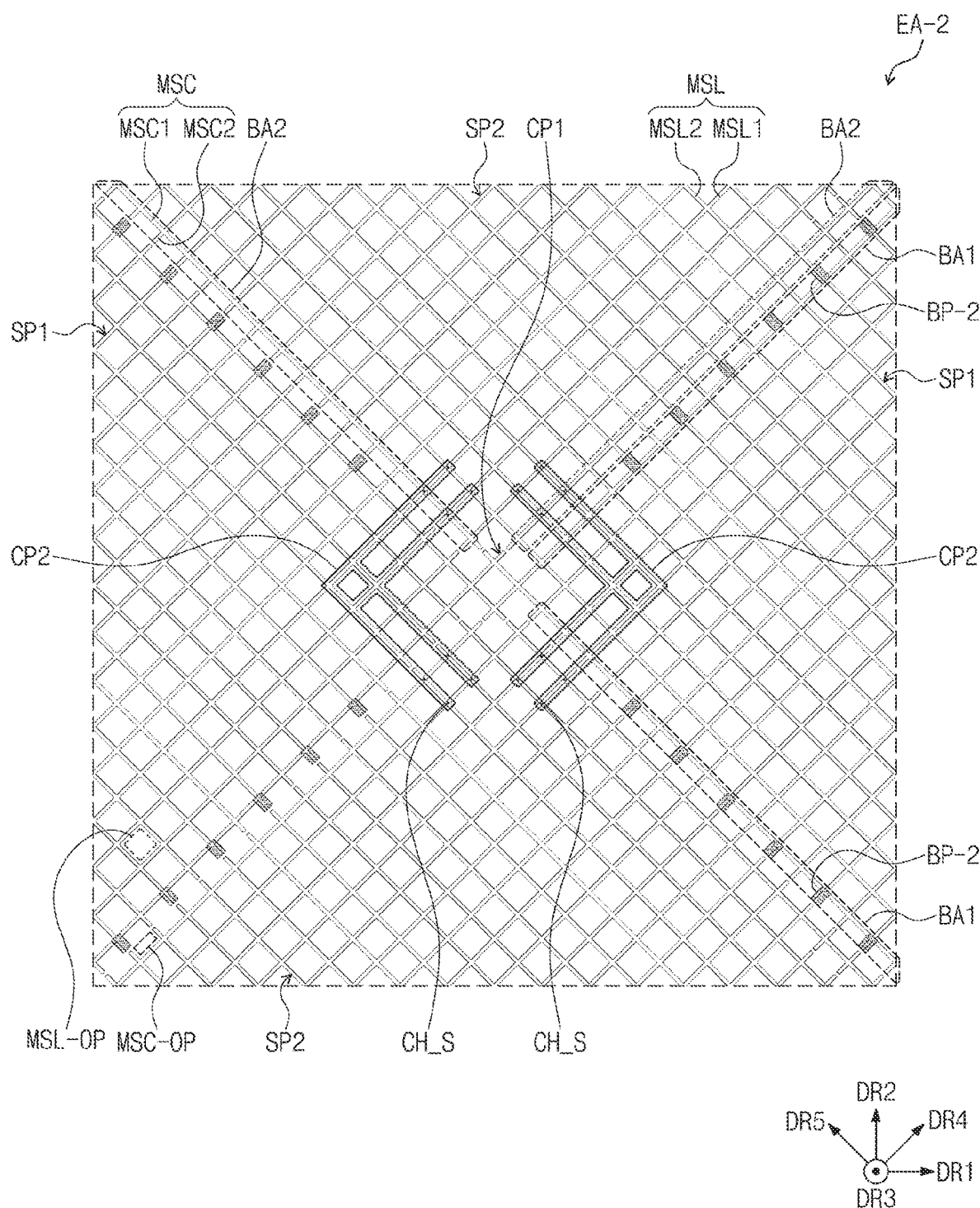
FIGS. 8A and 8B are plan views, each of which illustrates a portion of an electronic apparatus constructed according to an exemplary embodiment of the invention.
Figure 8B:
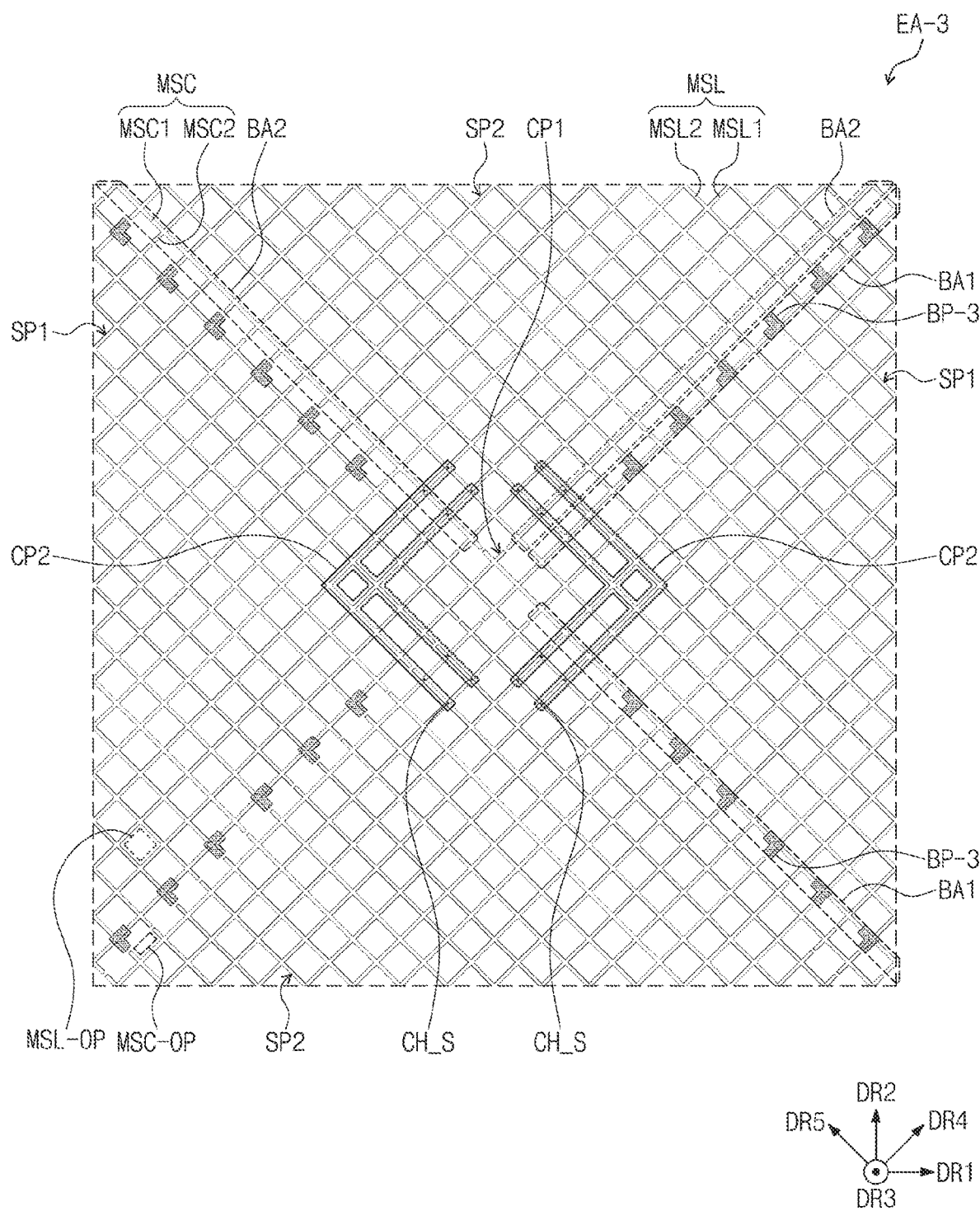

FIGS. 8A and 8B are plan views, each of which illustrates a portion of an electronic apparatus constructed according to an exemplary embodiment of the invention. For convenience in illustration, each of FIGS. 8A and 8B illustrates a region corresponding to FIG. 5. Hereinafter, an exemplary embodiment of the invention will be described with reference to FIGS. 8A and 8B. For concise description, an element previously described with reference to FIGS. 1, 2A, 2B, 2C, 2D, 2E, 2F, 3, 4, 5, 6A, 6B, 6C, 7A, 7B, and 7C may be identified by the same reference number without repeating a redundant description thereof.

As shown in FIG. 8A, an electronic apparatus EA-2 may include boundary patterns BP-2, each of which is disposed in the boundary area BA1 of the first sensor pattern SP1. The boundary pattern BP-2 may be overlapped with at least a portion of the protruding portions MSC2 of the cut mesh portion MSC, when viewed in a plan view. The boundary pattern BP-2 may have a shape similar to that of each of the protruding portions MSC2, as shown FIG. 8A, but the exemplary embodiments are not limited thereto.

As shown in FIG. 8B, an electronic apparatus EA-3 may include boundary patterns BP-3, each of which is disposed in the boundary area BA1 of the first sensor pattern SP1. Each of the boundary pattern BP-3 may be overlapped with the line portion MSC1 and a corresponding one of the protruding portions MSC2, when viewed in a plan view. For example, each of the boundary patterns BP-3 may be overlapped with not only a portion of the line portion MSC1 but also a portion of the protruding portions MSC2.

As described above, the positions of the boundary patterns BP-2 or BP-3 may be variously changed. For example, the boundary patterns BP-2 or BP-3 may be included in the first conductive layer 10 to be in contact with the cut mesh portion MSC or may be included in the second conductive layer 20 to be spaced apart from the cut mesh portion MSC when viewed in a sectional view. Alternatively, the boundary patterns BP-2 or BP-3 may be disposed on a layer different from a layer, on which the first and second conductive layers 10 and 20 are disposed, but the exemplary embodiments are not limited thereto.

Figure 9A:
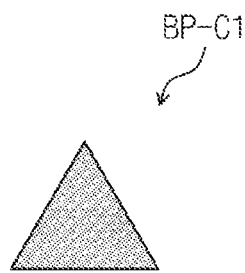
FIGS. 9A, 9B, and 9C are plan views illustrating shapes of a boundary pattern constructed according to exemplary embodiments of the invention.
Figure 9B:
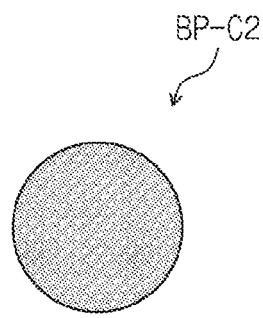
Figure 9C:
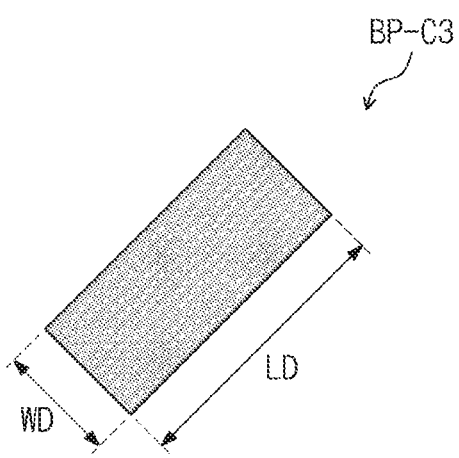

FIGS. 9A, 9B, and 9C are plan views illustrating shapes of a boundary pattern constructed according to an exemplary embodiment of the invention. Hereinafter, an exemplary embodiment of the invention will be described with reference to FIGS. 9A, 9B, and 9C.

As shown in FIG. 9A, a boundary pattern BP-C1 may have a substantially polygonal shape. In the illustrated embodiment, the boundary pattern BP-C1 is illustrated to have a substantially triangular shape.

As shown in FIG. 9B, a boundary pattern BP-C2 may have a shape with a curved portion. For example, the boundary pattern BP-C2 may have a substantially circular shape, as shown in FIG. 9B, but in certain exemplary embodiments, the boundary pattern BP-C2 may have an elliptical shape or a closed-loop shape defined by at least one curved line and at least one linear segment. However, the exemplary embodiments are not limited to this example.

As shown in FIG. 9C, a boundary pattern BP-C3 may have a rod-like or substantially rectangular shape extending in a specific direction. The boundary pattern BP-C3 may be a bar-shaped pattern whose length and width are given by LD and WD, respectively. The length LD of the boundary pattern BP-C3 may be defined in an extension direction of the line portion MSC1 (e.g., see FIG. 5), and the width WD of the boundary pattern BP-C3 may be defined in an extension direction of each of the protruding portions MSC2. Here, each of the boundary patterns BP-C3 may be overlapped with a plurality of the openings MSC-OP (e.g., see FIG. 5). The number of the openings MSC-OP overlapped with the boundary pattern BP-C3 may vary depending on the length LD of the boundary pattern BP-C3.

The width WD of the boundary pattern BP-C3 may be substantially equal to or shorter than a length of each of the protruding portions MSC2. However, the exemplary embodiments are not limited to this example, and for example, the width WD of the boundary pattern BP-C3 may be variously changed as long as the boundary pattern BP-C3 can be overlapped with only the first sensor patterns SP1 (e.g., see FIG. 5), not with the second sensor patterns SP2 (e.g., see FIG. 5) adjacent thereto.

In an exemplary embodiment, the shape of the boundary pattern BP-C1, BP-C2, or BP-C3 may be variously changed. Furthermore, a plurality of boundary patterns having different shapes may be disposed within the boundary area BA1 of the first sensor pattern SP1 (e.g., see FIG. 5). In the electronic apparatus according to an exemplary embodiment of the invention, the shape of the boundary pattern may be variously changed as long as a boundary between the first and second sensor patterns SP1 and SP2 is clearly recognized.

Figure 10A:
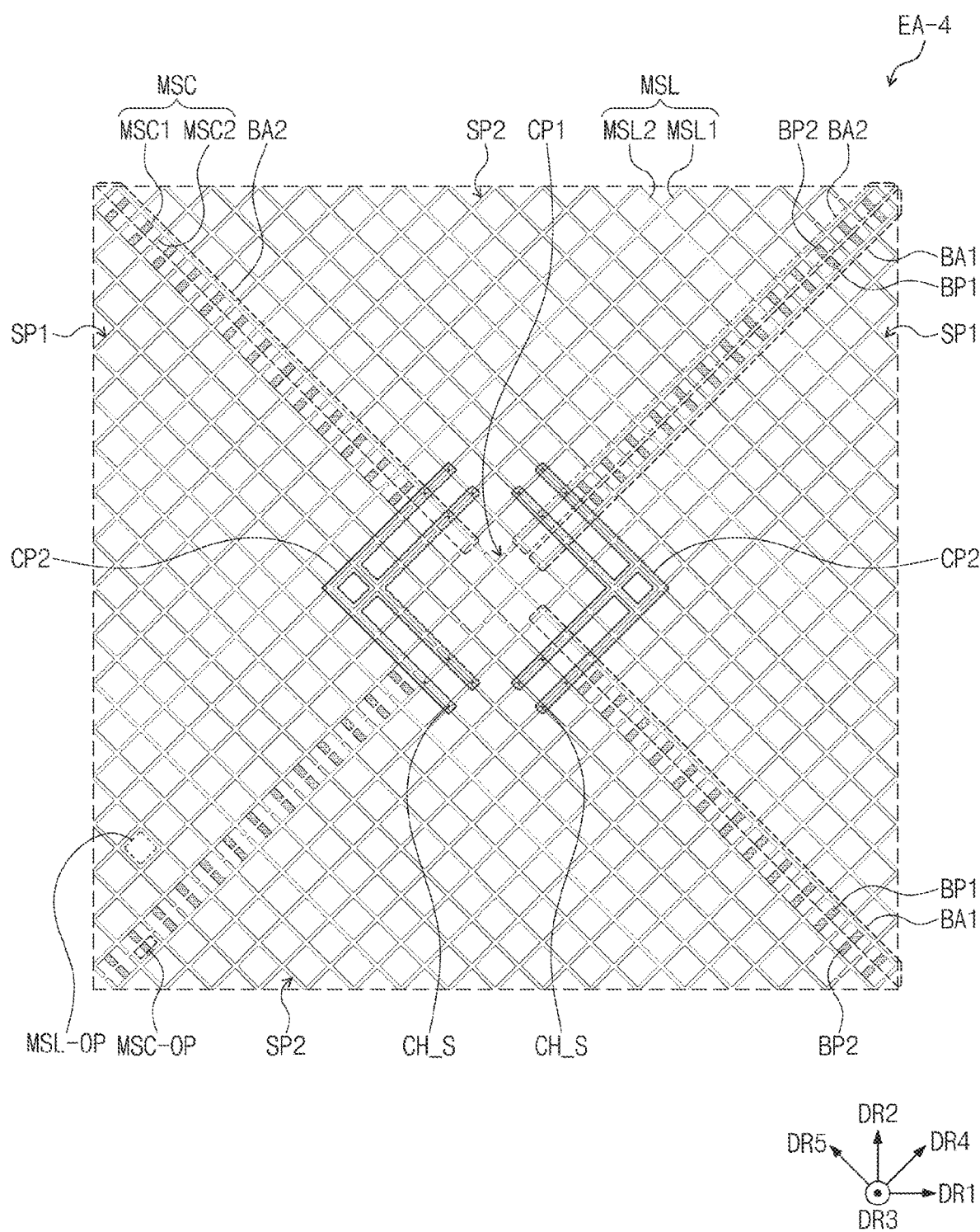
FIGS. 10A and 10B are plan views, each of which illustrates a portion of an electronic apparatus constructed according to an exemplary embodiment of the invention.
Figure 10B:
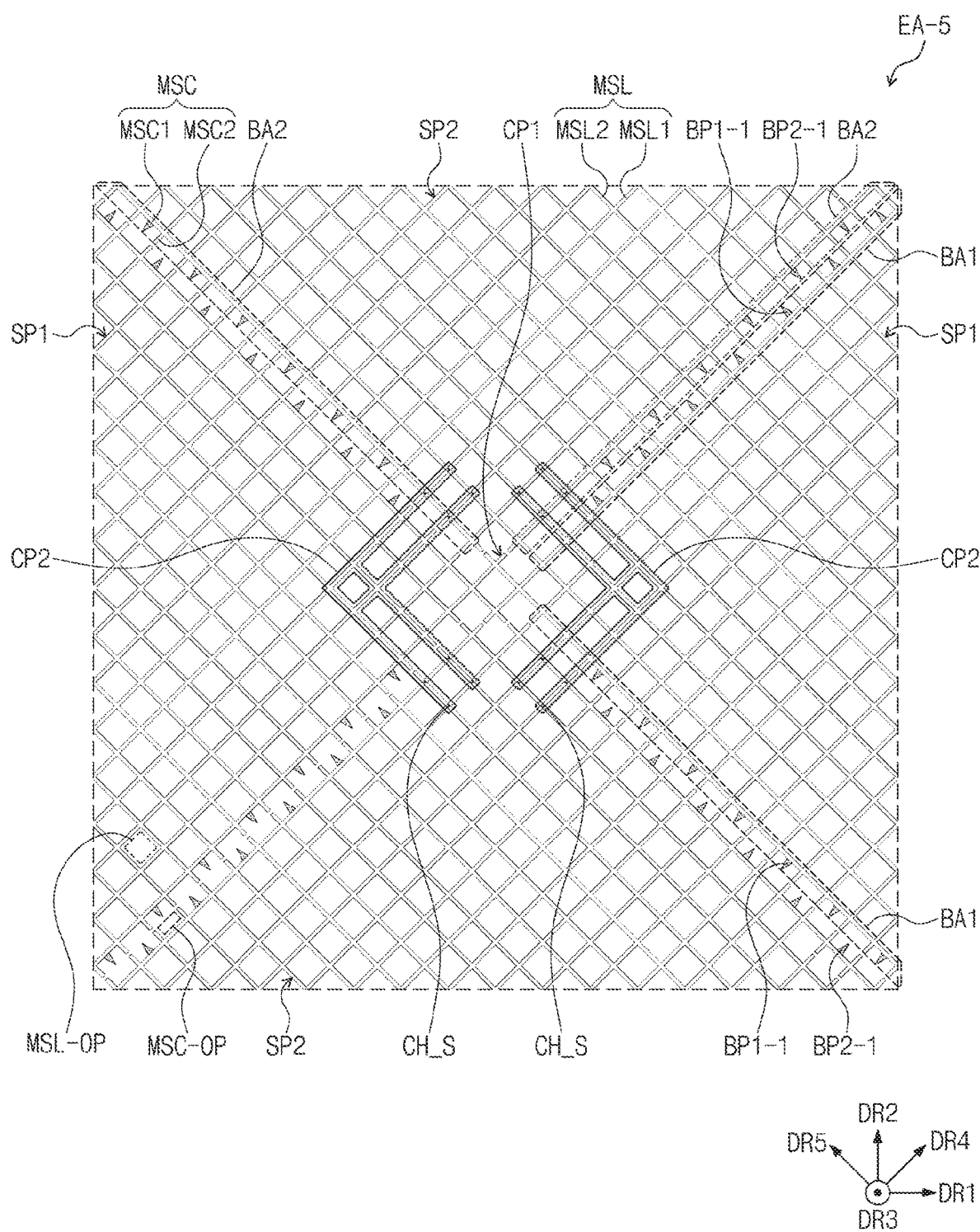

FIGS. 10A and 10B are plan views, each of which illustrates a portion of an electronic apparatus constructed according to an exemplary embodiment of the invention. For convenience in illustration, each of FIGS. 10A and 10B illustrates a region corresponding to FIG. 5. Hereinafter, an exemplary embodiment of the inventive concept will be described with reference to FIGS. 10A and 10B. For concise description, an element previously described with reference to FIGS. 1, 2A, 2B, 2C, 2D, 2E, 2F, 3, 4, 5, 6A, 6B, 6C, 7A, 7B, 7C, 8A, 8B, 9A, 9B, and 9C may be identified by the same reference number without repeating a redundant description thereof.

As shown in FIG. 10A, an electronic apparatus EA-4 may include a first boundary pattern BP1 and a second boundary pattern BP2, which are overlapped with the first sensor patterns SP1 and the second sensor patterns SP2, respectively, when viewed in a plan view.

The first boundary pattern BP1 may be disposed in the boundary area BA1 of the first sensor pattern SP1. For example, the first boundary pattern BP1 may be disposed in the opening MSC-OP of the boundary area BA1 of the first sensor pattern SP1. In an exemplary embodiment, the first boundary pattern BP1 may correspond to the boundary pattern BP of FIG. 5.

The second boundary pattern BP2 may be disposed in the boundary area BA2 of the second sensor pattern SP2. For example, the second boundary pattern BP2 may be disposed in the opening MSC-OP of the boundary area BA2 of the second sensor pattern SP2.

Since the boundary area BA1 of the first sensor pattern SP1 and the boundary area BA2 of the second sensor pattern SP2 face each other, the first boundary pattern BP1 and the second boundary pattern BP2 may be disposed to face each other. The first and second boundary patterns BP1 and BP2 may be disposed to be spaced apart from each other and may be electrically disconnected from each other.

As shown in FIG. 10B, in an electronic apparatus EA-5, a first boundary pattern BP1-1 and a second boundary pattern BP2-1 may be disposed to have a shape with direction, e.g., be anisotropic. For example, each of the first and second boundary patterns BP1-1 and BP2-1 may have a substantially triangular shape, as shown FIG. 10B. The first boundary pattern BP1-1 may have a vertex portion that is extended from the first sensor patterns SP1 in an outward direction. According to the shape of the first boundary pattern BP1-1, the vertex portion of the first boundary pattern BP1-1 may be used to represent the boundary of the first sensor patterns SP1. Thus, it may be possible to easily determine whether the first boundary pattern BP1-1 defines the boundary of the first sensor patterns SP1 or the boundary of the second sensor patterns SP2.

Similarly, the second boundary pattern BP2-1 may have a vertex portion that is extended from the second sensor patterns SP2 in an outward direction or toward the first sensor patterns SP1. According to the shape of the second boundary pattern BP2-1, the vertex portion of the second boundary pattern BP2-1 may be used to represent the boundary of the second sensor patterns SP2. Thus, it may be possible to easily determine whether the second boundary pattern BP2-1 defines the boundary of the first sensor patterns SP1 or the boundary of the second sensor patterns SP2.

The first and second boundary patterns BP1-1 and BP2-1 may be alternately arranged in a specific direction. For example, as shown in FIG. 10B, the first and second boundary patterns BP1-1 and BP2-1 adjacent to each other may not be overlapped with each other, when viewed in the fifth direction DR5. According to an exemplary embodiment of the invention, the number and positions of the boundary patterns BP1-1 or BP2-1 may be variously changed.

Figure 11A:
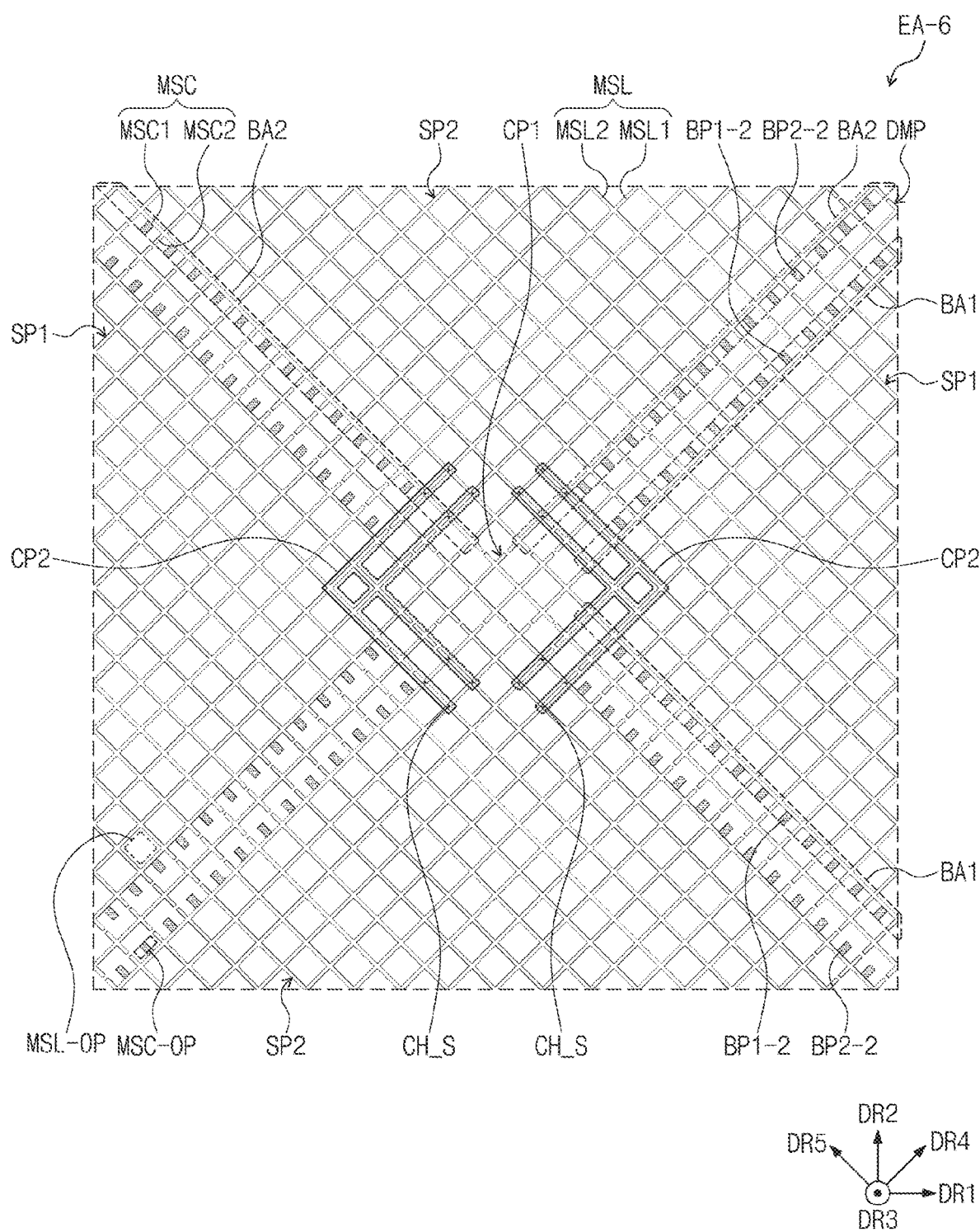
FIGS. 11A and 11B are plan views, each of which illustrates a portion of an electronic apparatus constructed according to an exemplary embodiment of the invention.
Figure 11B:
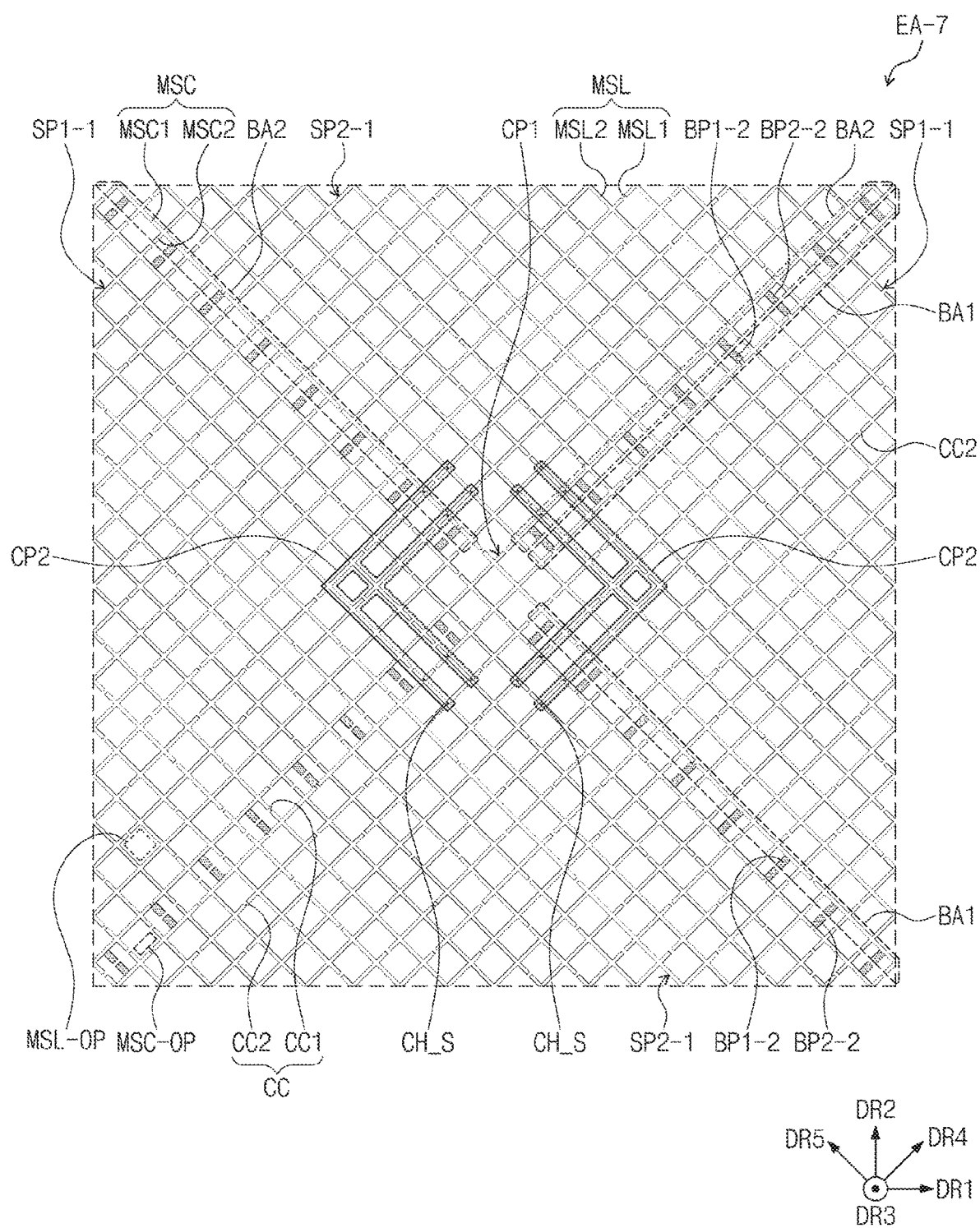

FIGS. 11A and 11B are plan views, each of which illustrates a portion of an electronic apparatus constructed according to an exemplary embodiment of the invention. For convenience in illustration, each of FIGS. 11A and 11B illustrates a region corresponding to FIG. 5. Hereinafter, an exemplary embodiment of the invention will be described with reference to FIGS. 11A and 11B. For concise description, an element previously described with reference to FIGS. 1, 2A, 2B, 2C, 2D, 2E, 2F, 3, 4, 5, 6A, 6B, 6C, 7A, 7B, 7C, 8A, 8B, 9A, 9B, 9C, 10A, and 10B may be identified by the same reference number without repeating a redundant description thereof.

As shown in FIG. 11A, an electronic apparatus EA-6 may further include a dummy pattern DMP. The dummy pattern DMP may be disposed at the boundary between the first and second sensor patterns SP1 and SP2. The dummy pattern DMP may be electrically disconnected from each of the first and second sensor patterns SP1 and SP2.

The dummy pattern DMP may include a plurality of the mesh lines MSL. Since the mesh lines MSL are formed to have a partially severed structure, it may be difficult to distinguish the first sensor patterns SP1, the dummy pattern DMP, and the second sensor patterns SP2 from each other.

According to an exemplary embodiment of the invention, due to the first and second boundary patterns BP1 and BP2, which are overlapped with the first and second sensor patterns SP1 and SP2, respectively, it is possible to easily distinguish the first and second sensor patterns SP1 and SP2 from the dummy pattern DMP. This simplifies the repair process and reduce process time for the repair, as discussed above.

As shown in FIG. 11B, an electronic apparatus EA-7 may include a plurality of cut-away portions CC, which are formed in the mesh lines MSL. The cut-away portions CC may include first cut-away portions CC1 and second cut-away portions CC2.

The first cut-away portions CC1 may be regions that are cut to define the first and second sensor patterns SP1-1 and SP2-1. The first cut-away portions CC1 may be formed to cut the mesh lines MSL, thereby forming the first and second sensor patterns SP1-1 and SP2-1. The portions of the mesh lines MSL, which are cut by the first cut-away portions CC1, may be electrically disconnected from each other. End portions of the protruding portions MSC2 may be defined by the first cut-away portions CC1.

The second cut-away portions CC2 may be formed in each of the first and second sensor patterns SP1-1 and SP2-1. The second cut-away portions CC2 may be formed in the first sensor patterns SP1 or in the second sensor patterns SP2. The portions of the mesh lines MSL, which are cut by the second cut-away portions CC2, may not be electrically disconnected from each other. Since the electronic apparatus EA-7 further includes the second cut-away portions CC2, it may be possible to reduce the difference in reflectance of light between internal regions of the first and second sensor patterns SP1-1 and SP2-1 and boundary areas therebetween.

In an exemplary embodiment, since the electronic apparatus EA-7 includes the boundary patterns BP1-2 and BP2-2, it is possible to easily distinguish the first cut-away portions CC1 from the second cut-away portions CC2. For example, since the boundary patterns BP1-2 and BP2-2 are disposed to be overlapped with the boundary area BA1 of the first sensor pattern SP1 or the boundary area BA2 of the second sensor pattern SP2, the boundary patterns BP1-2 and BP2-2 may be spaced apart from the second cut-away portions CC2, which are formed in each of the first and second sensor patterns SP1-1 and SP2-1. Thus, it is possible to easily determine the kind of each of the cut-away portions CC1 and CC2 or to easily distinguish the cut-away portion for defining the boundary area from the cut-away portion for improving the visibility, and make it possible to reduce difficulty and process time of a repair process and thereby to improve productivity.

Figure 12:
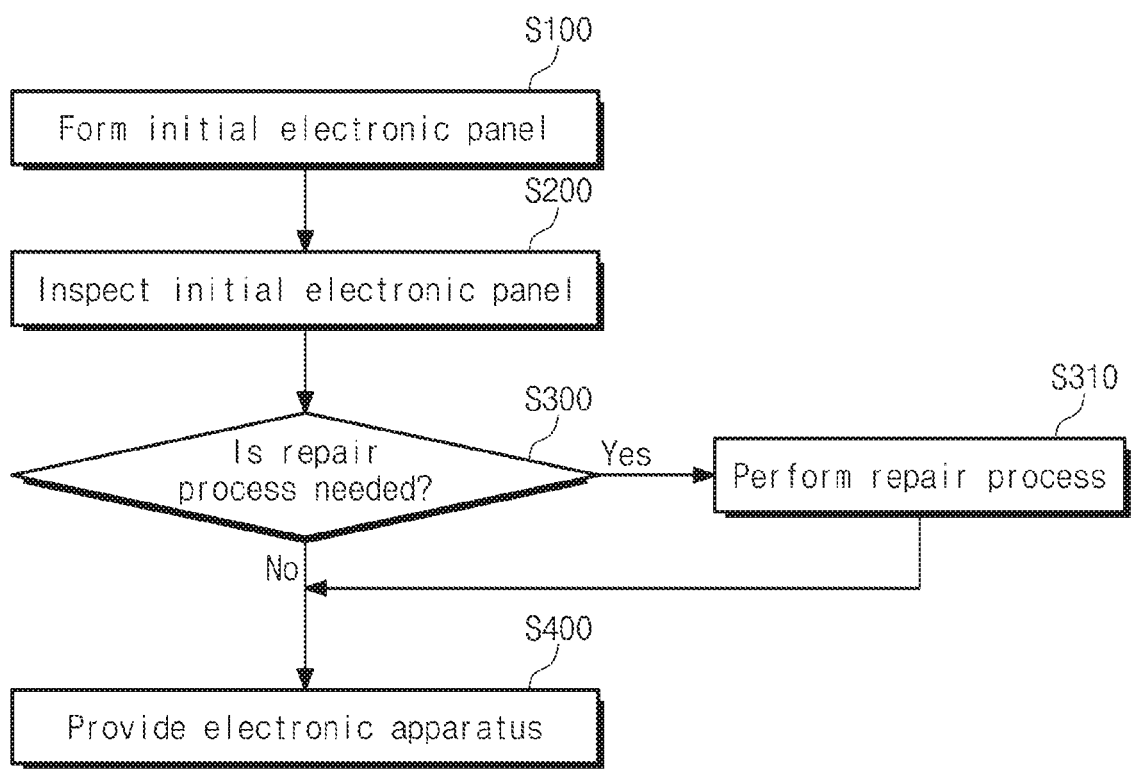
FIG. 12 is a flow chart illustrating a process of fabricating an electronic apparatus according to an exemplary embodiment of the invention.
Figure 13A:
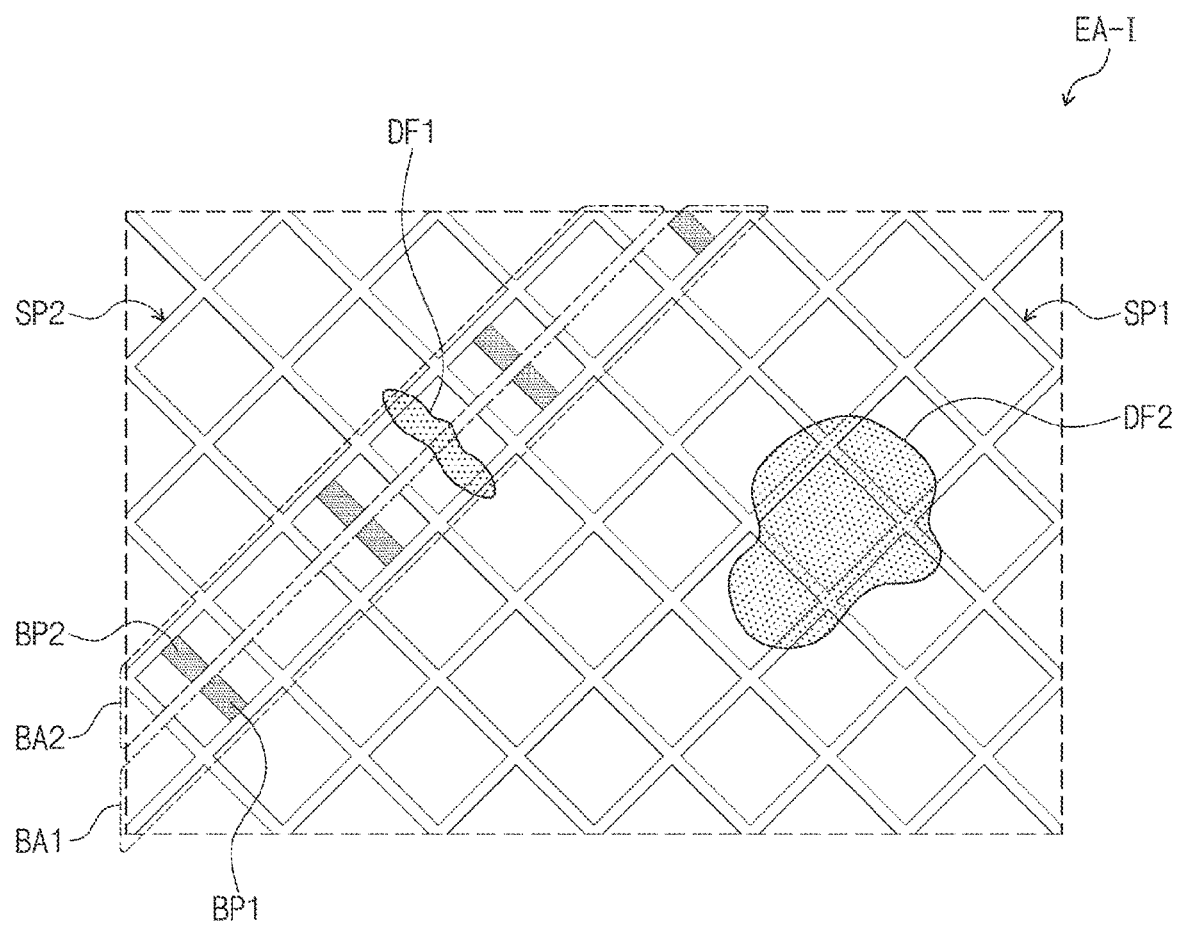
FIGS. 13A, 13B, and 13C are plan views schematically illustrating some process steps performed during the process of fabricating an electronic apparatus according to an exemplary embodiment of the invention.
Figure 13A:
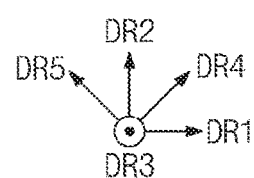
Figure 13B:
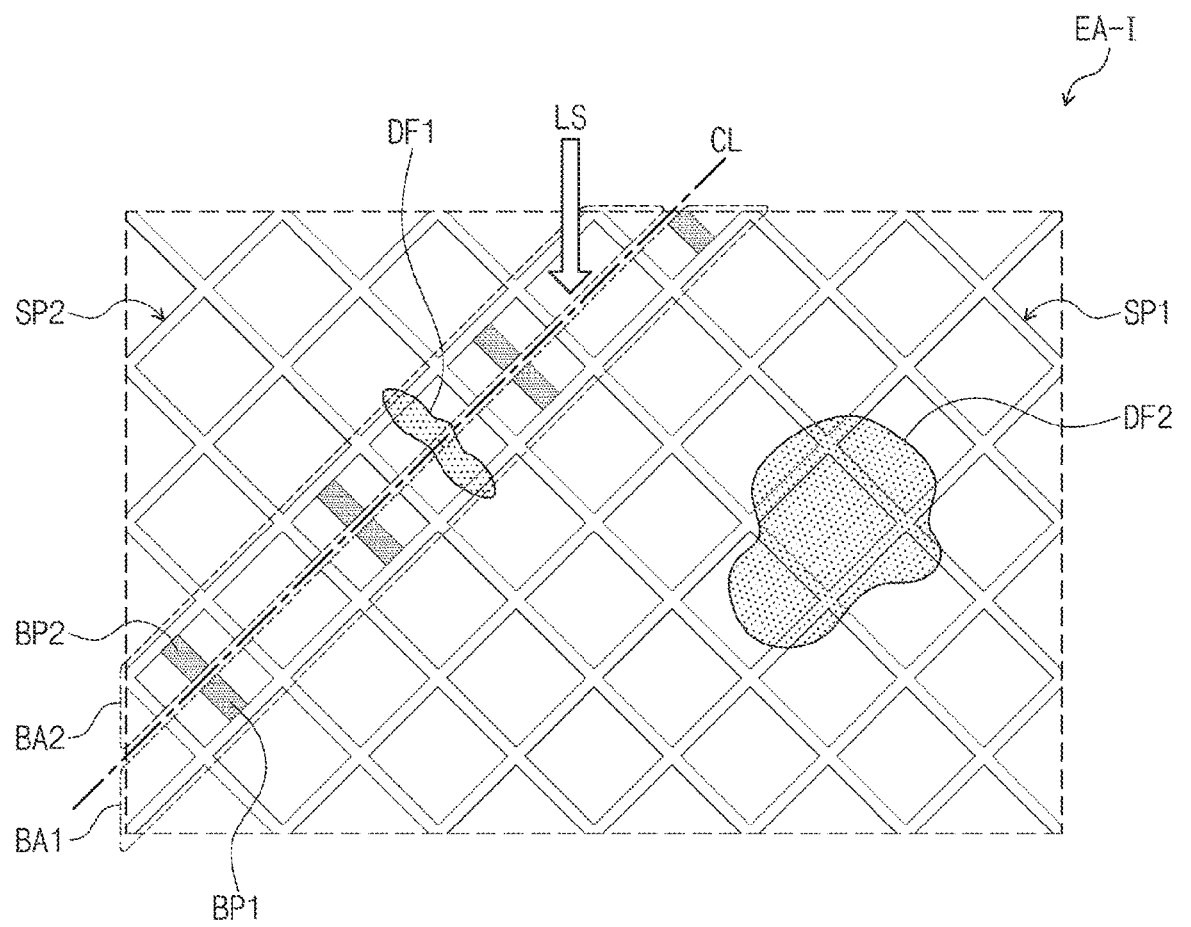
Figure 13B:
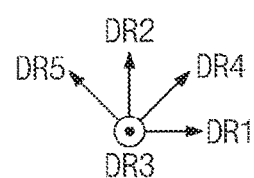
Figure 13C:
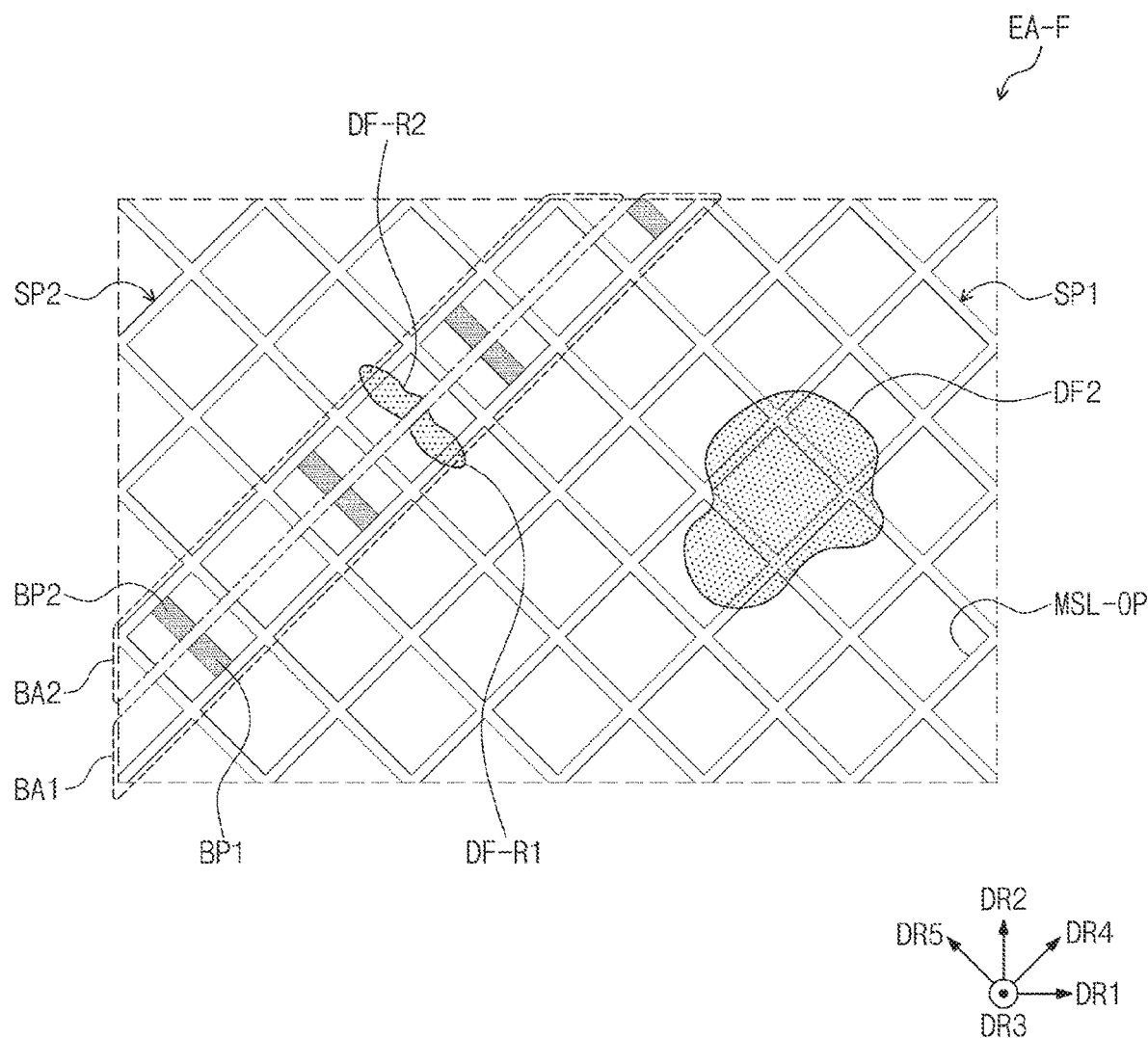

FIG. 12 is a flow chart illustrating a process of fabricating an electronic apparatus according to an exemplary embodiment of the invention. FIGS. 13A, 13B, and 13C are plan views schematically illustrating some process steps performed during the process of fabricating an electronic apparatus according to an exemplary embodiment of the invention. Hereinafter, an exemplary embodiment of the invention will be described with reference to FIGS. 12, 13A, 13B, and 13C.

As shown in FIG. 12, a process of fabricating an electronic apparatus may include steps of forming an initial electronic panel (in S100), inspecting the initial electronic panel (in S200), determining whether a repair process is needed (in S300), performing a repair process (in S310), and providing an electronic apparatus (in S400). For convenience in illustration, steps S300 and S310 of FIG. 12 are illustrated in FIGS. 13A, 13B, and 13C.

As shown in FIG. 12, to fabricate an electronic apparatus, an initial electronic panel may be formed (in S100). The initial electronic panel may be prepared to include at least the input sensing layer ISL (e.g., see FIG. 2A) or the input sensing panel ISP (e.g., see FIG. 2B). The initial electronic panel may correspond to an electronic apparatus, to which step S200 is not yet performed.

Thereafter, as shown in FIG. 12, the initial electronic panel may be inspected (in S200). The step S200 of inspecting the initial electronic panel may include measuring electric characteristics and visibility of the initial electronic panel. The step S200 of inspecting the initial electronic panel may be performed using a naked eye or a microscope to determine whether there is a defect pattern present. The defect pattern may be formed when there is a mask misalignment, an over-etching issue, or defective etching during the process of patterning the conductive layers 10 and 20 (e.g., see FIG. 4) or of forming the conductive patterns or may be formed by a foreign material supplied from the outside. The defect pattern may be a pattern, whose shape is different from that of a designed pattern, and may lead to deterioration in electric characteristics, such as a short circuit, or visibility of the electronic panel.

FIG. 13A illustrates an initial electronic panel EA-I including a first defect pattern DF1 and a second defect pattern DF2, which are formed near or between the first and second sensor patterns SP1 and SP2 adjacent to each other. The initial electronic panel EA-I of FIG. 13A is illustrated to correspond to the electronic apparatus EA-4 of FIG. 10A, except for the number of the first and second boundary patterns BP1 and BP2. The first defect pattern DF1 may be overlapped with all of the first and second sensor patterns SP1 and SP2. For example, the first defect pattern DF1 may be formed at a position covering both of the boundary area BA1 of the first sensor pattern SP1 and the boundary area BA2 of the second sensor pattern SP2.

The second defect pattern DF2 may be overlapped with one of the first and second sensor patterns SP1 and SP2. For example, the second defect pattern DF2 may be formed in the first sensor pattern SP1. Thus, the second defect pattern DF2 may not be connected to the second sensor pattern SP2.

Thereafter, as shown in FIG. 12, the step S300 may be performed to determine whether a repair process on the defect patterns DF1 and DF2 is needed. If the repair process is determined to be needed, the repair process S310 may be performed on the defect patterns DF1 and DF2, and thereafter, the electronic apparatus may be finished and shipped (in S400).

For example, as shown in FIGS. 13B and 13C, to provide a final electronic apparatus EA-F, the repair process S310 may be performed on the initial electronic panel EA-I. As described above, the electronic apparatus according to an exemplary embodiment of the invention may be configured to sense a change in electrostatic capacitance between the first and second sensor patterns SP1 and SP2 and to determine whether there is an external input.

Since the first defect pattern DF1 is connected to all of the first and second sensor patterns SP1 and SP2, the first defect pattern DF1 may electrically connect the first and second sensor patterns SP1 and SP2 to each other, and this may lead to a difficulty in maintaining an electric potential difference between the first and second sensor patterns SP1 and SP2. That is, the first defect pattern DF1 may be a pattern causing deterioration in electric characteristics of an electronic apparatus and may be a repair-needed pattern, i.e., a defect that needs to be repaired.

The second defect pattern DF2 may be overlapped with only the first sensor pattern SP1 and may not be connected to the second sensor pattern SP2. Even if the mesh lines MSL constituting the second sensor pattern SP2 are connected to each other by the second defect pattern DF2, such electrically-connected portions may be parts of the second sensor pattern SP2 and may not cause any defect. That is, the second defect pattern DF2 may not cause deterioration in electric characteristics between the first and second sensor patterns SP1 and SP2, and therefore may not be necessary to repair.

In the illustrated embodiment, the presence of the boundary patterns BP1 and BP2 may allow the first defect pattern DF1 and the second defect pattern DF2 to be easily distinguished from each other. In the case where the boundary between the first and second sensor patterns SP1 and SP2 is defined by the cut-away portions of the mesh lines MSL, it is not easy to distinguish the first and second sensor patterns SP1 and SP2 from each other.

According to an exemplary embodiment of the invention, the initial electronic apparatus may include the boundary patterns BP1 and BP2 to provide a clear distinction between the first and second sensor patterns SP1 and SP2. Thus, by examining whether the boundary patterns BP1 and BP2 is present within a region disposed with the defect patterns DF1 and DF2, it may be possible to easily determine whether the defect patterns DF1 and DF2 are repair-needed patterns.

For example, when the first defect pattern DF1 is located near or overlapped with both of the first and second boundary patterns BP1 and BP2, the first defect pattern DF1 may be easily determined to cover the boundary between the first and second sensor patterns SP1 and SP2, which is an important region to avoid defects that could cause short circuits and decrease in electrical characteristics.

For example, when the second defect pattern DF2 is spaced apart from the first and second boundary patterns BP1 and BP2, the second defect pattern DF2 may be determined not to overlap with the boundary between the first and second sensor patterns SP1 and SP2. Thus, without an additional inspection step, it is possible to readily determine that the second defect pattern DF2 will not cause significant deterioration in electric characteristics of an electronic apparatus.

Accordingly, as shown in FIGS. 13B and 13C, the first defect pattern DF1, which is determined to cause deterioration in electric characteristics of an electronic apparatus, may be cut along an imaginary cutting line CL to form a first portion DF-R1 and a second portion DF-R2, which are respectively overlapped with the first and second sensor patterns SP1 and SP2 and are spaced apart from each other. The cutting line CL may extend along a region between the first and second boundary patterns BP1 and BP2 and may correspond to the boundary between the first and second sensor patterns SP1 and SP2. Here, the cutting of the first defect pattern DF1 may be performed using a laser beam LS or a mechanical tool (e.g., knife), but the exemplary embodiments are not limited thereto.

Since the first defect pattern DF1 is divided into the first and second portions DF-R1 and DF-R2, the first and second sensor patterns SP1 and SP2, which are connected to each other by the first defect pattern DF1, may be electrically disconnected from each other. Thus, it may be possible to prevent or reduce deterioration in electric characteristics of an electronic apparatus, to easily provide the electronic apparatus, to improve the yield of the electronic apparatus, and to reduce process cost. Furthermore, since the repair process is selectively performed on the defect patterns DF1 and DF2, it may be possible to reduce process time and cost of the repair process.

Furthermore, since the second defect pattern DF2 covers some of the openings MSL-OP of the mesh lines MSL, the second defect pattern DF2 may lead to a reduction of amount of light to be emitted through the openings MSL-OP, when the second defect pattern DF2 is opaque. In an exemplary embodiment, the second defect pattern DF2 may have an area capable of preventing deterioration in visibility of the apparatus. However, the exemplary embodiments are not limited to this example. For example, in the case where the second defect pattern DF2 has an area that is large enough to cause deterioration in display quality, the second defect pattern DF2 may be additionally removed to improve reliability of the electronic apparatus.

Figure 14A:
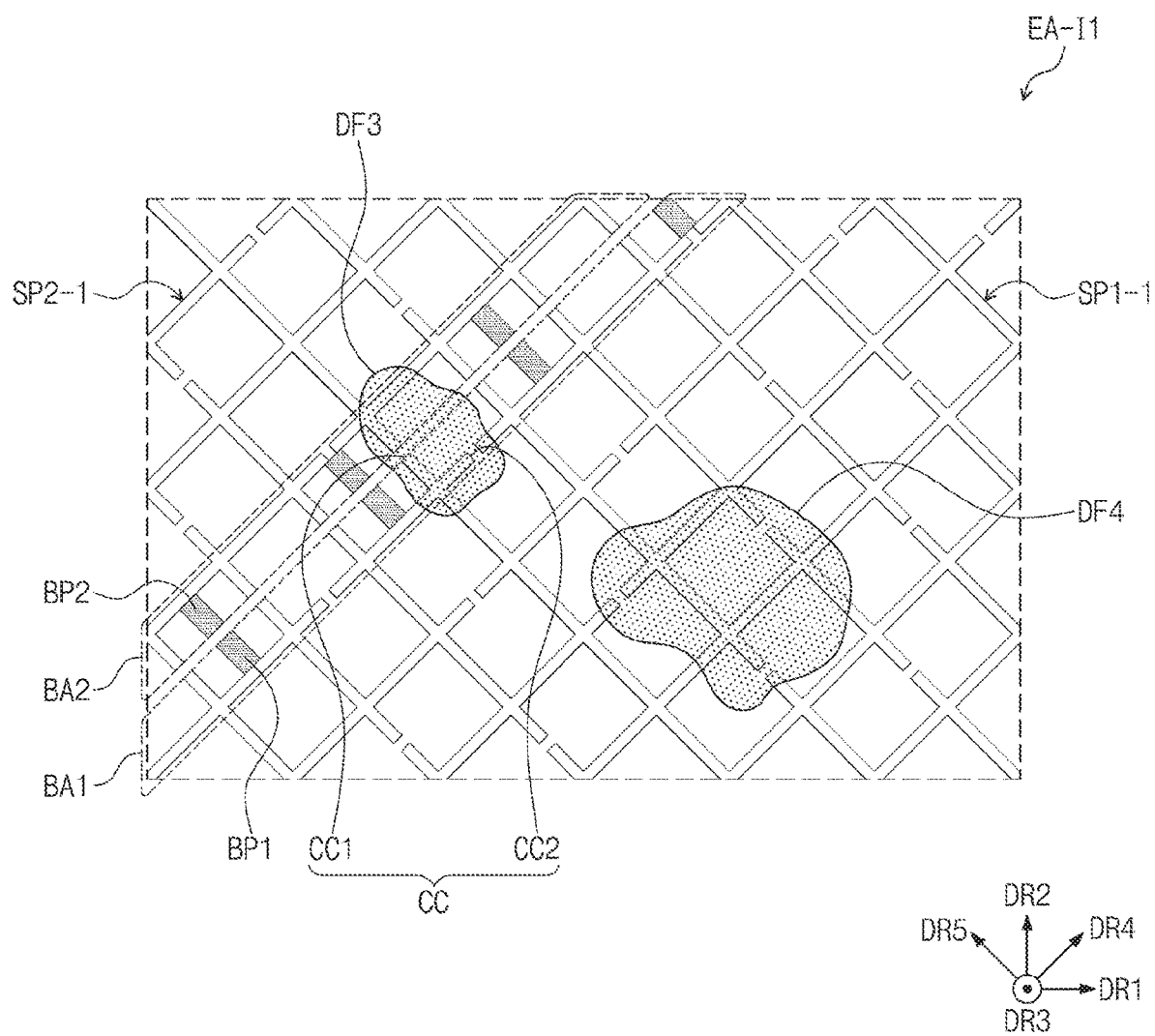
FIGS. 14A and 14B are plan views schematically illustrating some process steps performed during a process of fabricating an electronic apparatus according to an exemplary embodiment of the invention.
Figure 14B:
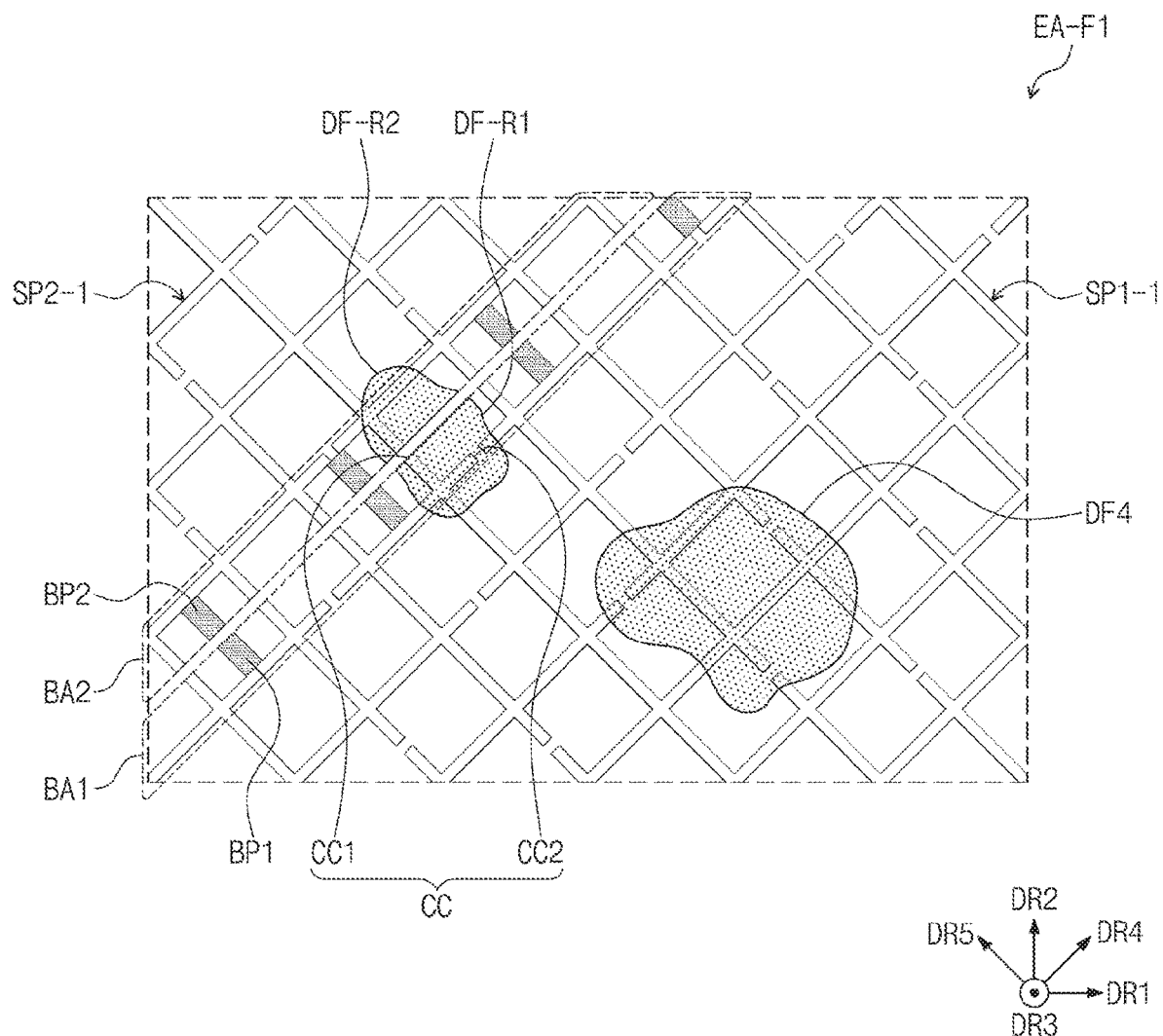

FIGS. 14A and 14B are plan views schematically illustrating some process steps performed during a process of fabricating an electronic apparatus according to an exemplary embodiment of the invention. For convenience in illustration, FIGS. 14A and 14B illustrate steps corresponding to the steps S300 and S310 of FIG. 12 or corresponding to FIGS. 13B and 13C.

Except for the number of the boundary patterns BP1 and BP2, FIG. 14A exemplarily illustrates an initial electronic panel EA-I1 corresponding to the electronic apparatus EA-7 including the first and second sensor patterns SP1-1 and SP2-1, shown in FIG. 11B. Hereinafter, an exemplary embodiment of the invention will be described with reference to FIGS. 14A and 14B. For concise description, an element previously described with reference to FIGS. 1 to 13C may be identified by the same reference number without repeating a redundant description thereof.

As shown in FIGS. 14A and 14B, the initial electronic panel EA-I1 may include a first defect pattern DF3 and a second defect pattern DF4. Each of the first and second defect patterns DF3 and DF4 may be formed to at least partially cover a plurality of cut-away portions CC1 and CC2, which are formed in the mesh lines MSL.

The first defect pattern DF3 may be disposed near and overlapped with the boundary patterns BP1 and BP2. This shows that the first defect pattern DF3 is likely to be a pattern that is formed on the boundary between the first and second sensor patterns SP1-1 and SP2-1 to connect the first and second sensor patterns SP1-1 and SP2-1 to each other.

This shows that the cut-away portions covered with the first defect pattern DF3 may include at least the first cut-away portion CC1. In the illustrated embodiment, the first defect pattern DF3 may cover the first cut-away portion CC1 and the second cut-away portion CC2. The first defect pattern DF3 may be cut along the first cut-away portion CC1 through the repair process S310 to form a plurality of portions DF-R1 and DF-R2 that are spaced apart from each other, and thus, the deterioration in electric characteristics between the first and second sensor patterns SP1-1 and SP2-1 may be easily overcome or reduced.

The second defect pattern DF4 may be formed on a region that is not overlapped with, or spaced apart from, the boundary patterns BP1 and BP2. In the illustrated embodiment, the presence of the boundary patterns BP1 and BP2 may show that the second defect pattern DF4 is regarded as a pattern that does not cause deterioration in electric characteristics between the first and second sensor patterns SP1-1 and SP2-1. Thus, even if the second defect pattern DF4 covers more cut-away portions than the first defect pattern DF3 does, a repair process is not necessary to eliminate the defect pattern DF4. And moreover, it may be possible to easily determine that the repair process for improving the electric characteristics of the electronic apparatus is not needed therefor.

In the electronic apparatus including the mesh lines MSL, since the boundary between the sensor patterns SP1-1 and SP2-1 is defined by the cut-away portions CC1 and CC2, it may not be easy to distinguish the first cut-away portion CC1, which is disposed to define the boundary between the sensor patterns SP1-1 and SP2-1, from the second cut-away portion CC2, which is disposed in the sensor patterns SP1-1 and SP2-1 to improve visibility of the electronic apparatus. In the illustrated embodiment, due to the presence of the boundary patterns BP1 and BP2, it may be possible to easily determine whether the defect patterns DF3 and DF4 are regarded as repair-needed patterns, to simplify the repair process, and to reduce a process time. Furthermore, although there are the defect patterns DF3 and DF4, by performing the repair process S310, it may be possible to provide a final electronic apparatus EA-F 1 with improved electric characteristics and to improve productivity of the fabrication process.

According to the exemplary embodiments of the invention, in an electronic apparatus with indistinguishable sensor patterns, it is possible to easily determine whether a pattern is a defect pattern that should be repaired, without an additional process. Thus, a repair process can be selectively performed on only defect patterns, and thus, the exemplary embodiments of the invention may simplify fabrication and/or reduce cost of the repair process. Accordingly, the exemplary embodiments of the invention may increase manufacturing yield of the electronic apparatus.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. An electronic apparatus, comprising:
a first sensor pattern having a first peripheral area extending in a first direction;
a second sensor pattern spaced apart from the first sensor pattern and having a second peripheral area, the second peripheral area extending in the first direction and facing the first peripheral area in a second direction intersecting the first direction to form a boundary between the first and second sensor patterns;
a first connection pattern connected to the first sensor pattern;
a second connection pattern connected to the second sensor pattern, the first and second connection patterns being disposed on layers different from each other; and
a first pattern overlapping the first peripheral area in a plan view and spaced apart from the second sensor pattern to increase visibility of the boundary, and
wherein:
each of the first sensor pattern and the second sensor pattern comprises a plurality of mesh lines defining a plurality of openings, the mesh lines including first mesh lines extending in the first direction, and second mesh lines extending in the second direction and intersecting the first mesh lines;
the first peripheral area comprises a line portion extending in the first direction, and a plurality of protruding portions connected to the line portion and spaced apart from each other in the first direction;

the line portion is one of the first mesh lines;

the protruding portions are portions of the second mesh lines, which intersect the line portion and protrude from the line portion toward the second peripheral area; and the first pattern directly overlaps with or directly contacts the line portion when viewed in a plan view.

2. The electronic apparatus of claim 1, wherein the first pattern and the first sensor pattern are disposed on the same layer.

3. The electronic apparatus of claim 2, wherein the first pattern and the first sensor pattern comprise the same material.

4. The electronic apparatus of claim 2, wherein the first pattern is overlapped with at least one of the openings of the first sensor pattern disposed in the first peripheral area and opened toward the second peripheral area.

5. The electronic apparatus of claim 2, wherein the first pattern is in contact with one of the mesh lines disposed in the first sensor pattern, and wherein the first pattern overlaps one of the mesh lines.

6. The electronic apparatus of claim 1, wherein the first pattern and the first sensor pattern are disposed on different layers spaced apart from each other in a sectional view and overlapped with each other in a plan view.

7. The electronic apparatus of claim 1, wherein the first pattern is disposed between adjacent protruding portions.

8. The electronic apparatus of claim 1, wherein the first pattern comprises a boundary pattern overlapped with at least one of the protruding portions, when viewed in a plan view.

9. The electronic apparatus of claim 1, wherein the first pattern comprises a boundary pattern overlapped with at least one of regions where the line portion and the protruding portions intersects, when viewed in a plan view.

10. The electronic apparatus of claim 1, further comprising a second pattern overlapping the second sensor pattern and spaced apart from the first sensor pattern.

11. The electronic apparatus of claim 10, wherein the first pattern comprises a plurality of first boundary patterns that are arranged along the first peripheral area, and the second pattern comprises a plurality of second boundary patterns that are arranged along the second peripheral area.

12. The electronic apparatus of claim 11, wherein the first boundary patterns and the second boundary patterns are alternately arranged in staggered fashion.

13. The electronic apparatus of claim 1, wherein the first pattern has a decreasing width in a direction toward the second sensor pattern, when measured in the first direction.

14. The electronic apparatus of claim 1, further comprising a dummy pattern disposed between the first sensor pattern and the second sensor pattern, the dummy pattern being electrically disconnected from the first sensor pattern and the second sensor pattern, and wherein the first pattern is spaced apart from the dummy pattern.

15. The electronic apparatus of claim 1, wherein the first sensor pattern further comprises at least one cut-away portion opening a side portion of at least one of the openings, and the at least one cut-away portion formed by cutting at least a portion of the mesh lines of the first sensor pattern.

16. The electronic apparatus of claim 1, further comprising a display panel including a plurality of organic light emitting devices disposed in a plurality of light emitting regions, wherein the light emitting regions are overlapped with the openings, when viewed in a plan view.

17. The electronic apparatus of claim 1, further comprising a display panel including a plurality of quantum dots or a plurality of quantum rods disposed in a plurality of light emitting regions, respectively, wherein the light emitting regions are overlapped with the openings, when viewed in a plan view.

18. An electronic apparatus, comprising:

a first sensor pattern including having a first peripheral area extending in a first direction;

a second sensor pattern spaced apart from the first sensor pattern and having a second peripheral area, the second peripheral area extending in the first direction and facing the first peripheral area in a second direction intersecting the first direction to form a boundary between the first and second sensor patterns;

a first connection pattern connected to the first sensor pattern;

a second connection pattern connected to the second sensor pattern, the first and second connection patterns being disposed on layers different from each other; and a first pattern overlapping the first peripheral area in a plan view and spaced apart from the second sensor pattern to increase visibility of the boundary, wherein each of the first sensor pattern and the second sensor pattern comprises a plurality of mesh lines defining a plurality of openings, wherein the first sensor pattern, the second sensor pattern, and the first connection pattern are disposed on a same layer, and the first pattern and the second connection pattern are disposed on the same layer.

19. An electronic apparatus, comprising:

a display panel including a plurality of light emitting regions;

a first sensor pattern on the display panel, the first sensor pattern having a first peripheral area extending in a first direction;

a second sensor pattern on the display panel and apart from the first sensor pattern, and the second sensor pattern having a second peripheral area extending in the first direction and facing the first peripheral area in a second direction intersecting the first direction to form a boundary between the first and second sensor patterns; and a plurality of boundary patterns overlapping the first sensor pattern, and wherein:

each of the first and second sensor patterns comprises mesh lines connected to each other to form a integral unit and the mesh lines define a plurality of openings overlapping the light emitting regions;

the boundary patterns overlap at least a portion of the mesh lines of the first sensor pattern and are spaced apart from the mesh lines of the second sensor pattern;

the mesh lines including first mesh lines extending in the first direction, and second mesh lines extending in the second direction and intersecting the first mesh lines;

the first peripheral area comprises a line portion extending in the first direction, and a plurality of protruding portions connected to the line portion and spaced apart from each other in the first direction;

the line portion is one of the first mesh lines;

the protruding portions are portions of the second mesh lines, which intersect the line portion and protrude from the line portion toward the second peripheral area; and the boundary patterns directly overlap with or directly contact the line portion, when viewed in a plan view.

20. The electronic apparatus of claim 19, wherein the boundary patterns and the mesh lines of the first sensor pattern are disposed on a same layer.

21. The electronic apparatus of claim 20, wherein a portion of the mesh lines of the first sensor pattern is overlapped with the boundary patterns, and Wherein the portion of the mesh lines and the boundary patterns are stacked each other.

22. The electronic apparatus of claim 20, wherein the mesh lines of the first sensor pattern and the boundary patterns comprise the same material.

23. The electronic apparatus of claim 19, wherein the boundary patterns and the first sensor pattern are disposed on different layers, and the boundary patterns are spaced apart from the mesh lines of the first sensor pattern, when viewed in a sectional view.

24. The electronic apparatus of claim 19, wherein the display panel comprises organic light emitting devices, quantum dots, or quantum rods disposed in the light emitting regions.

* * * * *